(12) United States Patent
Tian et al.

(10) Patent No.: US 12,585,315 B2
(45) Date of Patent: Mar. 24, 2026

(54) FAN ENCLOSURE WITH ADJUSTABLE SIDE VENTING

(71) Applicant: Intel Corporation, Santa Clara, CA (US)

(72) Inventors: Xiyong Tian, Beijing (CN); Chunlin Bai, ChengDu (CN); Baocí George Sun, Folsom, CA (US); Li Zhang, Shenzhen (CN); Chiu Lun Ronald Cheng, Kowloon (HK)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 18/285,210

(22) PCT Filed: Jun. 25, 2021

(86) PCT No.: PCT/CN2021/102421
§ 371 (c)(1),
(2) Date: Sep. 29, 2023

(87) PCT Pub. No.: WO2022/267014
PCT Pub. Date: Dec. 29, 2022

(65) Prior Publication Data
US 2024/0241554 A1     Jul. 18, 2024

(51) Int. Cl.
*G06F 1/20* (2006.01)
*H05K 7/20* (2006.01)

(52) U.S. Cl.
CPC ......... *G06F 1/206* (2013.01); *H05K 7/20145* (2013.01)

(58) Field of Classification Search
CPC . G06F 1/20; G06F 1/203; G06F 1/206; G06F 1/181; G06F 1/1601; G06F 1/1662; G06F 2200/201; G06F 1/16; G06F 1/183; G06F 1/3203; H05K 7/20154; H05K 7/20172; H05K 7/20145; H05K 7/20209; H05K 7/20727; H05K 7/20136;
(Continued)

(56) References Cited

U.S. PATENT DOCUMENTS 6,011,689 A * 1/2000 Wrycraft ................... G06F 1/20
361/679.48
9,845,805 B2 * 12/2017 Bhutani ..................... G06F 1/20
(Continued)

FOREIGN PATENT DOCUMENTS

| CN | 101419492 A | 4/2009 |
| CN | 102103396 A | 6/2011 |

(Continued)

OTHER PUBLICATIONS

Feb. 4, 2025 (EP) Search Report—App. 21946508.5.
(Continued)

*Primary Examiner* — Michael A Matey
(74) *Attorney, Agent, or Firm* — Banner & Witcoff, Ltd.

(57) ABSTRACT
Particular embodiments described herein provide for an electronic device that can be configured to include a first heat source, a second heat source, and a fan inside a fan enclosure between the first heat source and the second heat source. The fan enclosure includes a main vent to direct air from the fan towards a heatsink and one or more side vents to direct air from the fan towards the first heat source or the second heat source.

10 Claims, 25 Drawing Sheets

(58) Field of Classification Search
CPC .. H05K 7/20; H05K 7/20972; H05K 7/20163;
H05K 7/20181; H05K 7/20336; H05K
5/0213; H05K 7/202; H05K 7/20718;
H05K 7/20772; H05K 7/20809; H05K
7/20818; H05K 7/20909; H05K 9/0041;
F04D 25/166; F04D 29/4226; F04D
19/002; F04D 29/424; F04D 25/14; F04D
29/4246; F28D 2021/0029; H01L
2023/4062; H01L 23/34; F25B 2321/023;
F28F 1/325; F28F 2250/102; G11B
33/128; G11B 33/142; G11B 33/1426
See application file for complete search history.

(56) References Cited

U.S. PATENT DOCUMENTS

| | | | | |
|---|---|---|---|---|
| 10,190,602 | B2 * | 1/2019 | Hsin | F04D 17/16 |
| 10,215,439 | B2 * | 2/2019 | Lin | G06F 1/206 |
| 12,061,503 | B2 * | 8/2024 | Dan | H05K 7/20145 |
| 2005/0103477 | A1 * | 5/2005 | Kim | G06F 1/203 |
| | | | | 165/104.33 |
| 2006/0181851 | A1 | 8/2006 | Frank et al. | |
| 2008/0156004 | A1 * | 7/2008 | MacDonald | G06F 1/203 |
| | | | | 62/89 |
| 2010/0084123 | A1 * | 4/2010 | Shishido | F04D 29/582 |
| | | | | 165/104.34 |
| 2010/0167636 | A1 * | 7/2010 | Bhattacharya | G06F 1/206 |
| | | | | 454/239 |
| 2010/0309441 | A1 * | 12/2010 | Wang | H04N 9/3144 |
| | | | | 353/61 |
| 2011/0245976 | A1 * | 10/2011 | Thompson | H05K 7/20209 |
| | | | | 700/275 |
| 2012/0026680 | A1 * | 2/2012 | Ke | G06F 1/20 |
| | | | | 361/695 |
| 2013/0081779 | A1 * | 4/2013 | Liao | G05D 23/19 |
| | | | | 165/11.1 |
| 2018/0095508 | A1 * | 4/2018 | Yi | H05K 7/20163 |
| 2019/0041924 | A1 * | 2/2019 | Varadarajan | F25B 27/00 |
| 2019/0050031 | A1 * | 2/2019 | Utz | H05K 7/20327 |
| 2022/0279660 | A1 * | 9/2022 | Savage | H05K 7/20727 |

FOREIGN PATENT DOCUMENTS

| | | |
|---|---|---|
| CN | 111970892 A | 11/2020 |
| EP | 1531384 A2 | 5/2005 |
| KR | 20160116255 A | 10/2016 |
| TW | M619677 U | 11/2021 |
| TW | M620617 U | 12/2021 |
| WO | 2018144287 A1 | 8/2018 |

OTHER PUBLICATIONS

PCT/CN2021/102421 International Search Report and Written Opinion of the International Searching Authority dated Feb. 8, 2022 (10 pages).
Sep. 16, 2025 (TW) Office Action—App. 111109820.

* cited by examiner

Cooling air

AIR INTAKE

2300

START

A BOARD LAYOUT FOR AN ELECTRONIC DEVICE IS CREATED — 2302

THE BOARD LAYOUT IS TESTED AND IT IS DETERMINED THAT A HOT SPOT AREA EXISTS THAT NEEDS COOLING — 2304

A FAN ENCLOSURE WITH SIDE VENTING IS USED IN THE BOARD LAYOUT — 2306

ONE OR MORE SIDE VENTS OF THE FAN ENCLOSURE WITH SIDE VENTING ARE ADJUSTED TO FORCE AIR ONTO THE HOT SPOT AREA — 2308

END

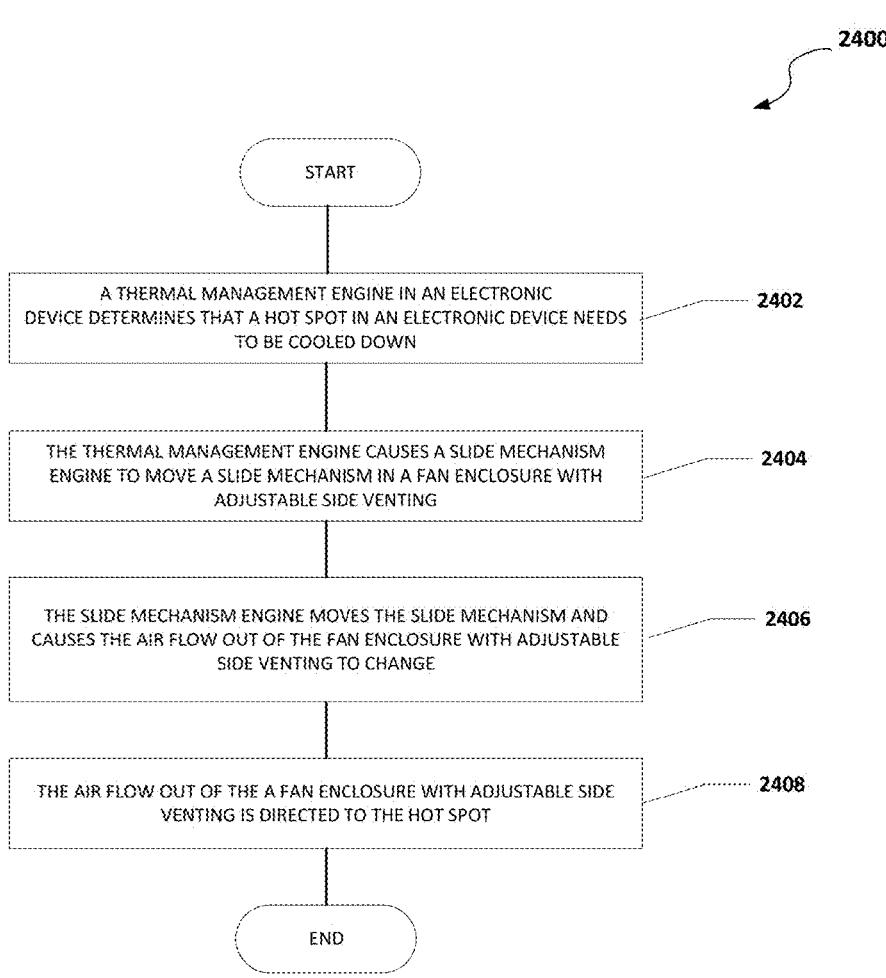

2400

START

A THERMAL MANAGEMENT ENGINE IN AN ELECTRONIC DEVICE DETERMINES THAT A HOT SPOT IN AN ELECTRONIC DEVICE NEEDS TO BE COOLED DOWN — 2402

THE THERMAL MANAGEMENT ENGINE CAUSES A SLIDE MECHANISM ENGINE TO MOVE A SLIDE MECHANISM IN A FAN ENCLOSURE WITH ADJUSTABLE SIDE VENTING — 2404

THE SLIDE MECHANISM ENGINE MOVES THE SLIDE MECHANISM AND CAUSES THE AIR FLOW OUT OF THE FAN ENCLOSURE WITH ADJUSTABLE SIDE VENTING TO CHANGE — 2406

THE AIR FLOW OUT OF THE A FAN ENCLOSURE WITH ADJUSTABLE SIDE VENTING IS DIRECTED TO THE HOT SPOT — 2408

END

FIGURE 24

FAN ENCLOSURE WITH ADJUSTABLE SIDE VENTING

TECHNICAL FIELD

This disclosure relates in general to the field of computing and/or device cooling, and more particularly, to a fan enclosure with adjustable side venting.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems. Insufficient cooling can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 24 is a simplified flowchart illustrating potential operations that may be associated with the system in accordance with an embodiment of the present disclosure.

Figures 1A, 1B:
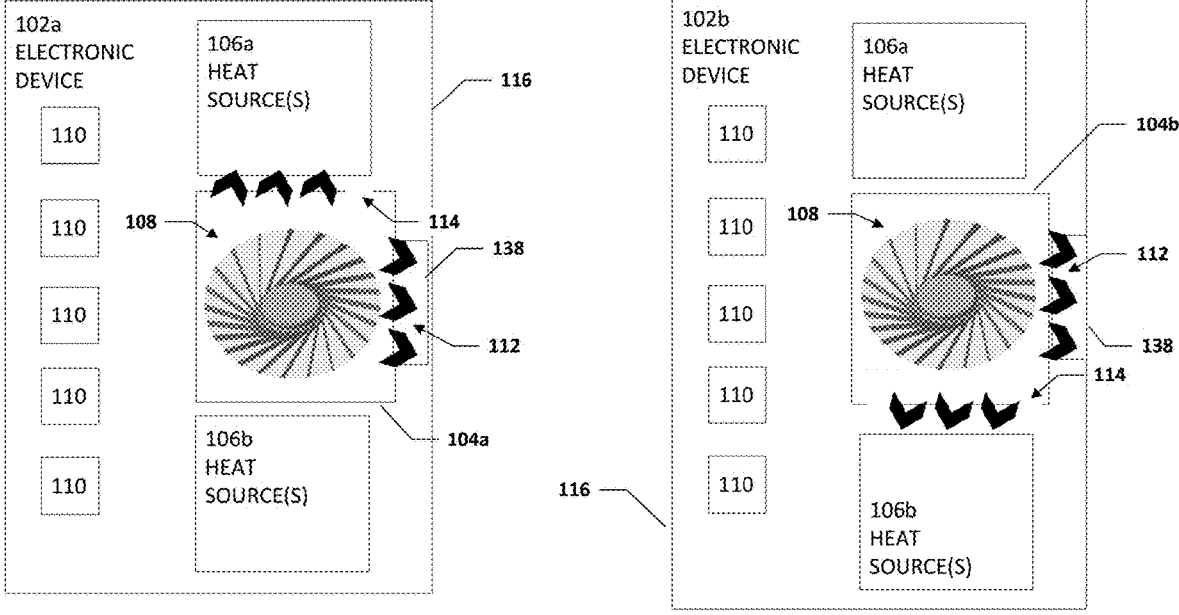
FIG. 1A is a simplified block diagram of a system to enable a fan enclosure with adjustable side venting, in accordance with an embodiment of the present disclosure.
FIG. 1B is a simplified block diagram of a system to enable a fan enclosure with adjustable side venting, in accordance with an embodiment of the present disclosure.

The FIGURES of the drawings are not necessarily drawn to scale, as their dimensions can be varied considerably without departing from the scope of the present disclosure.

DETAILED DESCRIPTION

The following detailed description sets forth examples of apparatuses, methods, and systems relating to enabling a fan enclosure with adjustable side venting. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

Furthermore, the term "connected" may be used to describe a direct connection between the things that are connected, without any intermediary devices, while the term "coupled" may be used to describe either a direct connection between the things that are connected, or an indirect connection through one or more intermediary devices. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Turning to FIG. 1A, FIG. 1A is a simplified block diagram of an electronic device 102a configured with a fan enclosure with adjustable side venting, in accordance with an embodiment of the present disclosure. In an example, the electronic device 102a can include a fan enclosure with adjustable side venting 104a, a one or more first heat sources 106a, one or more second heat sources 106b, a fan 108, and one or more electronic components 110. The fan 108 can be in the fan enclosure with adjustable side venting 104a. The fan enclosure with adjustable side venting 104a can include a main vent 112 and a plurality of side vents 114.

A chassis 116 is the enclosure, outer body, outer structure, etc. of the electronic device 102a that contains the components of the electronic device 102a (excluding a keyboard, mouse, peripherals, etc. if present). Each of the first heat sources 106a and the second heat sources 106b may be a heat generating device (e.g., processor, logic unit, field programmable gate array (FPGA), chip set, integrated circuit (IC), a graphics processor, graphics card, battery, memory, or some other type of heat generating device). Each of the electronic components 110 can be a device or group of devices available to assist in the operation or function of the electronic device 102a. The main vent 112 can direct air over a heatsink 138, or more specifically, fins of a heatsink or some other cooling means.

Turning to FIG. 1B, FIG. 1B is a simplified block diagram of an electronic device 102b configured with a fan enclosure with adjustable side venting, in accordance with an embodiment of the present disclosure. In an example, the electronic device 102b can include a fan enclosure with adjustable side venting 104b, the one or more first heat sources 106a, the one or more second heat sources 106b, the fan 108, and one or more electronic components 110. The fan 108 can be in the fan enclosure with adjustable side venting 104b. The main vent 112 can direct air over a heatsink 138, or more specifically, fins of a heatsink or some other cooling means. The fan enclosure with adjustable side venting 104b can include the main vent 112 and the plurality of side vents 114. Each of the first heat sources 106a and the second heat sources 106b may be a heat generating device (e.g., processor, logic unit, field programmable gate array (FPGA), chip set, integrated circuit (IC), a graphics processor, graphics card, battery, memory, or some other type of heat generating device). Each of the electronic components 110 can be a device or group of devices available to assist in the operation or function of the electronic device 102b.

The fan enclosure with adjustable side venting 104 can be used to cool specific components and areas and lower the skin temperature of hot spots areas in the chassis 116. The position of side venting can be adjusted to meet board placement requirements. The fan enclosure with adjustable side venting 104 provides an active cooling solution for some components and areas that are not covered by a thermal heat spreader (e.g., cold plate and heat pipe or vapor chamber). The size and quantity of venting in the fan enclosure with adjustable side venting 104 can be adjusted base on placement, component, and hot spots requirements. The angle of venting also can be adjusted base on air flow distribution. In an example, a slide mechanism (described below), side vent plugs (described below), or some other means may be used during manufacturing of the electronic device to adjust the size and quantity of the open side vents 114 in the fan enclosure with adjustable side venting 104 and to direct airflow from the side vents 114 to the identified hot spots in the component layout.

In an illustrative example, when a layout for an electronic device is designed, one or more hot spots can be identified as areas that may require additional cooling. For example, areas around a central processing unit (CPU) and graphics processing unit (GPU) may be identified as areas that require additional cooling. Typically, a heat pipe, vapor chamber, cold plate, etc. are added to the areas to provide additional cooling to components. Sometimes, the heat pipe, vapor chamber, cold plate, etc. may not be able to provide the necessary cooling or adding the heat pipe, vapor chamber, cold plate, etc. may not be economically feasible or possible due to design constraints. If additional cooling to components is needed and the heat pipe, vapor chamber, cold plate, etc. are not able to provide the additional cooling, the air from the side vents 114 can be used to cool the areas or components that need additional cooling. More specifically, in one example, if during a system layout design, it is determined that a solid-state drive (SSD), battery, voltage regulator, CPU, and/or the skin of the chassis around a specific area (e.g., the CPU area) may not be properly cooled, the air from the side vents 114 can be used to cool the SSD, the battery, voltage regulator, CPU, and/or the skin of the chassis around the specific area. The side venting position, quantity, and size can be adjusted to provide anticipated cooling needs. For example, a slide mechanism can be used to adjust venting hole size and position to dynamical adjust the volume of air flow for different board configurations. The fan enclosure with adjustable side venting 104 can be used to cool almost any components or areas by using different volumes of air flow to try and help improve system performance.

For example, when the layout for electronic device 102a is designed, the first heat sources 106a be identified as areas that may require additional cooling. Heat pipes, vapor chambers, cold plates, etc. may be added to the area around the first heat sources 106a but the heat pipe, vapor chamber, cold plate, etc. may not provide enough cooling due to design constraints. As illustrated in FIG. 1A, side vents 114 of the fan enclosure with adjustable side venting 104a can be used to adjust the volume of air flow from the fan enclosure with adjustable side venting 104a for different board configurations and to cool the first heat sources 106a.

In another example, when the layout for electronic device 102b is designed, the second heat sources 106b may be identified as areas that may require additional cooling. Heat pipes, vapor chambers, cold plates, etc. may be added to the area around the second heat sources 106b but the heat pipe, vapor chamber, cold plate, etc. may not provide enough cooling due to design constraints. As illustrated in FIG. 1B, side vents 114 of the fan enclosure with adjustable side venting 104b can be used to adjust the volume of air flow from the fan enclosure with adjustable side venting 104b for different board configurations and to cool the second heat sources 106b.

In some examples, if the first heat sources 106a or the second heat sources 106b are processors and the fan enclosure with adjustable side venting 104 can allow the processors to operate with an increased clock frequency for a longer period of time than if the fan enclosure with adjustable side venting 104 was not providing additional cooling. A processor's clock frequency represents how many cycles per second the processor can execute. The higher the clock frequency of the processor, the more "switching" can be done per time-unit by the processor. To increase the clock frequency of the processor, the voltage to the processor is increased. As the voltage increases so does the power and the amount of heat that is generated by the heat source. The clock frequency is also referred to as clock speed, clock rate, PC frequency, CPU frequency, and other similar terms.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

It is to be understood that other embodiments may be utilized, and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems. For example, in some devices, it can be difficult to cool a particular heat source or area.

System level thermal and mechanical engineering is critical and can be difficult to balance, especially in thin and/or light devices, where a system needs to provide a sustained and transient power performance while providing a long battery life. For example, a high chassis skin temperature will often result in CPU throttling even if the CPU has not reached a critical temperature and still has a temperature margin that would allow the CPU to operate at a high sustained power level.

To try and obtain better system performance, some systems attempt to optimize the thermal module design including the fan, heat pipe, vapor chamber, chassis material, system air inlet and outlet to increase their performance and cooling capacity. Some devices, especially thin and/or light devices, have system component placement constraints which limits the size of the fan. Often the curve of the fan blade is designed to try and obtain more air flow. Some gaming systems use a fan with dual air outlets to try and obtain more cooling capability, but dual air outlets occupy a larger space which impacts board design, I/O connectors' placement, etc. In many cases, the design of the fan blade to increase airflow and/or dual air outlets will increase the noise from the fan and the increased noise can be large enough to impact the user experience.

Some systems increase the Z-height of the heat pipe to try and obtain maximum heat carrying capacity (Qmax). However, increasing the Z-height of the heat pipe will impact the overall system Z-height and is not a desired solution. A vapor chamber is a good temperature equalization material, it has better spreading performance, but the cost of currently designed vapor chambers is relatively high and can increase the overall cost of a device that includes a vapor chamber. Currently, only premium, and limited gaming designs use a vapor chamber due to the relatively high cost of the vapor chamber. Some systems use air inlets with high air permeability however, these inlets typically have a relatively high cost and low yield rate. Also, air inlets need a sealing mesh to avoid exposing inner components to end users. The air outlet is limited by the fan size and fin quantity and there is not much flexibility to optimize the air outlet once the fan size is fixed. What is needed is a system to enable a fan enclosure with adjustable side venting.

A system to enable a fan enclosure with adjustable side venting, as outlined in FIGS. 1A and 1B, can resolve these issues (and others). In an example, a fan enclosure with adjustable side venting (e.g., the fan enclosure with adjustable side venting 104) can be configured to provide cooling air to cool specific components directionally and lower the skin temperature of hot spot areas so that a processor (e.g., CPU or GPU) can run at higher PL1 power to improve performance before throttling. The fan can include one or more slidable windows around the side venting areas. The side venting size and location can be adjusted by use of slidable windows to satisfy board placement requirements. The adjustable venting size and location can help the cooling capability of the fan outlet area without any space increase and cost additions for extra heat pipes or vapor chambers. In some examples, the fan enclosure with adjustable side vents can improve system performance by ten to fifteen percent without changing the system placement of components and increasing the Z-height by directionally cooling specific area or components to lower the skin temperature of the chassis In an example, a slidable window can be used to adjust side venting to accommodate for difference system component placement requirements. Existing fans typically have one or two air outlets to cool the fin and heat pipe which used to transfer the heat generated by a CPU or GPU. Hot spots of skin of the chassis are normally located around CPU or GPU areas. In addition, the CPU and GPU are not the only heat source, as memory, voltage regulators, battery, SSD, WLAN also will bring more heat into the system and, in some systems, cannot be covered by thermal spreader. These bring more thermal constrains to system design. The fan enclosure with adjustable side venting can be used to cool areas that can be difficult to cool in current system designs.

The fan with side venting can be used to cool specific components and areas and lower the skin temperature of hot spots areas in the chassis. The position of side venting can be adjusted to meet board placement requirements. The fan with side venting provides an active cooling solution for some components and areas that is not covered by a thermal spreader or vapor chamber. The size and quantity of venting in the fan with side venting can be adjusted base on placement, component, and hot spots requirements. The angle of venting also can be adjusted base on air flow distribution.

In one example, if during a system layout design, it is determined that an SSD may not be properly cooled, the air from the side venting can be used to cool the SSD. In another example, if during a system layout design, it is determined that the battery, voltage regulator, CPU, and/or the skin of the chassis around a specific area (e.g., the CPU area) may not be properly cooled, the air from side venting can be used to cool the battery, voltage regulator, CPU, and/or the skin of the chassis around the specific area. The side venting position, quantity, and size can be adjusted to provide anticipated cooling needs. For example, a slide mechanism can be used to adjust venting hole size and position to adjust the volume of air flow for different board configurations. The fan enclosure with adjustable side vents can be used to cool almost any components or areas by using different volumes of air flow to try and help improve system performance.

In an illustrative example, the fan enclosure with adjustable side vents can include a slide mechanism that can be adjusted to a position to create different venting hole sizes and adjust the volume of air from the side vents. The slide mechanism may be a metal slide or some other material with though holes (or windows). The fan enclosure with adjustable side vents can include a fan encloser that can be used to guide the slide mechanism and seal the though holes if the through holes are not needed for a particular system design. The slide mechanism can be adjusted along the slideway of the fan encloser to close off a through hole or narrow the through hole to create different volumes of air from the fan enclosure with adjustable side vents. If the slide mechanism moves counterclockwise relative to the blades of the fan, the air flow direction will change, and if the slide mechanism moves to cover some of the through holes, the through holes will be sealed by the fan encloser, the size of venting holes becomes smaller, and the volume of air flow will be smaller. In the same way, if the slide mechanism moves clockwise relative to the blades of the fan, the air flow direction will change, and the slide mechanism moves to cover some of the through holes, the size of venting holes becomes smaller, so the volume of air flow will be smaller. The counterclockwise and clockwise movement of the slide mechanism can create different cooling directions and cooling capability base on the different position of the slide mechanism. When the slide mechanism position is adjusted, the cooling air direction and volume will be changed. Base on the board placement of components, the position of the slide mechanism can be used to cool specific components and/or areas.

In some current systems, particularly gaming systems, component placement, especially the GPU, the CPU, memory, and voltage regulators are all typically close to one or more fans. This is because the components that significantly create more heat due to running at higher frequency and higher voltage need more cooling and for thin and light systems, it is preferable to located the components close to a fan so a minimum length of heat pipe and vapor chamber are needed to move the heat collected from the components to the heatsink and the fan. The system can take advantage of the placement of the components close to the fan and use air from side venting of the fan enclosure to directly cool the hot components. The size, direction, angle, and quantity of side venting can be customized for different systems.

Figure 2:
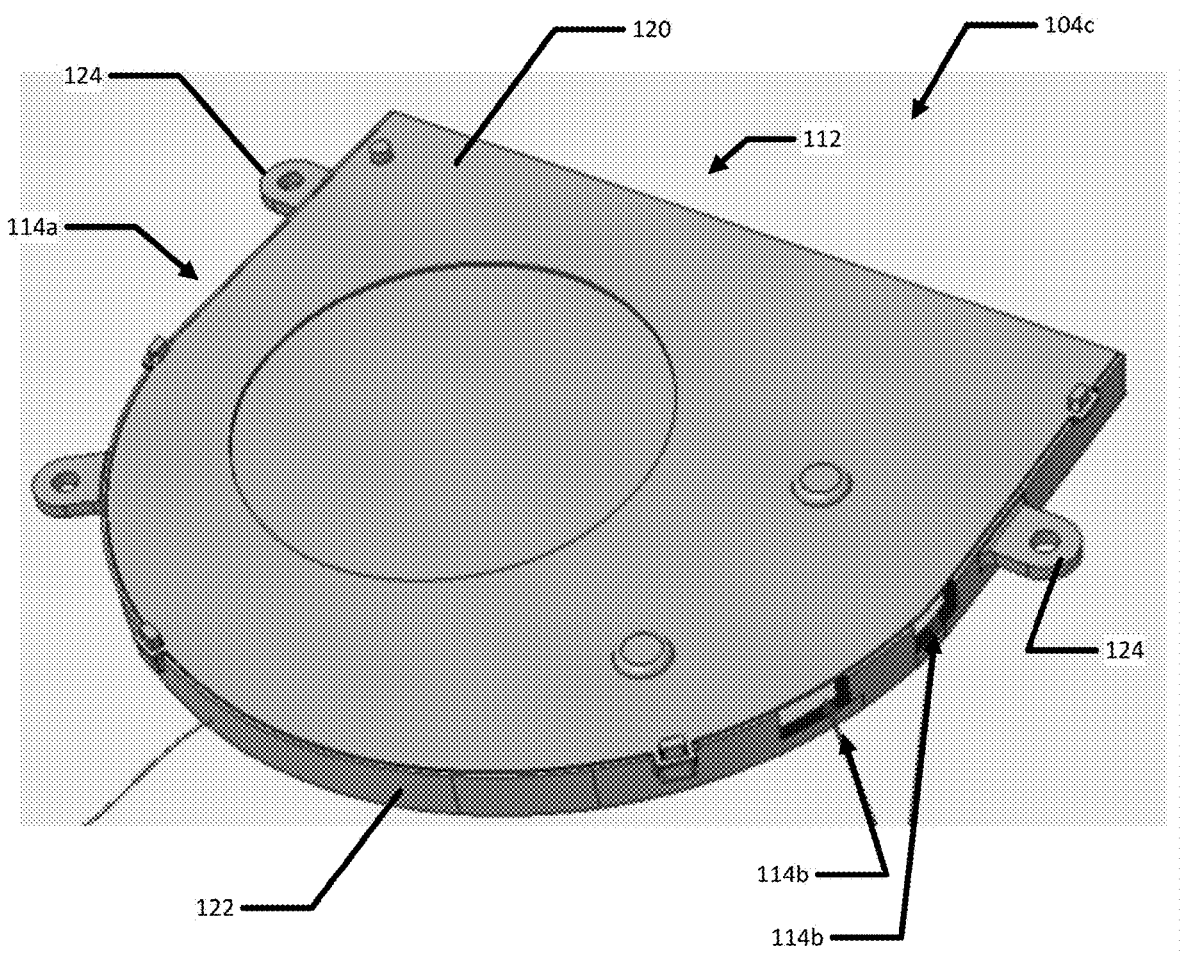
FIG. 2 is a simplified block diagram perspective view of a fan enclosure with adjustable side venting, in accordance with an embodiment of the present disclosure.

Turning to FIG. 2, FIG. 2 is a simplified perspective view of a block diagram of a fan enclosure with adjustable side venting 104c, in accordance with an embodiment of the present disclosure. In an example, the fan enclosure with adjustable side venting 104c can include the main vent 112, side vents 114a and 114b, a top cover 120, a main body 122, and attachment tabs 124. As illustrated in FIG. 2, the top cover 120 can be over the main body 122 to help protect the fan 108 (not shown) that is inside the fan enclosure with adjustable side venting 104c and to help force the air from the fan out of the main vent 112 and any open side vents 114. For example, as illustrated in FIG. 2, the side vents 114b are open to allow the air from the fan 108 in the enclosure with adjustable side venting 104c to escape and help cool heat sources and/or hot spots near the side vents 114b. The side vents 114a can be closed the help increase the airflow out of side vents 114b. The attachment tabs 118 can help secure the fan enclosure with adjustable side venting 104c to the chassis 116 (not shown) of the electronic device 100 (not shown).

Figure 3:
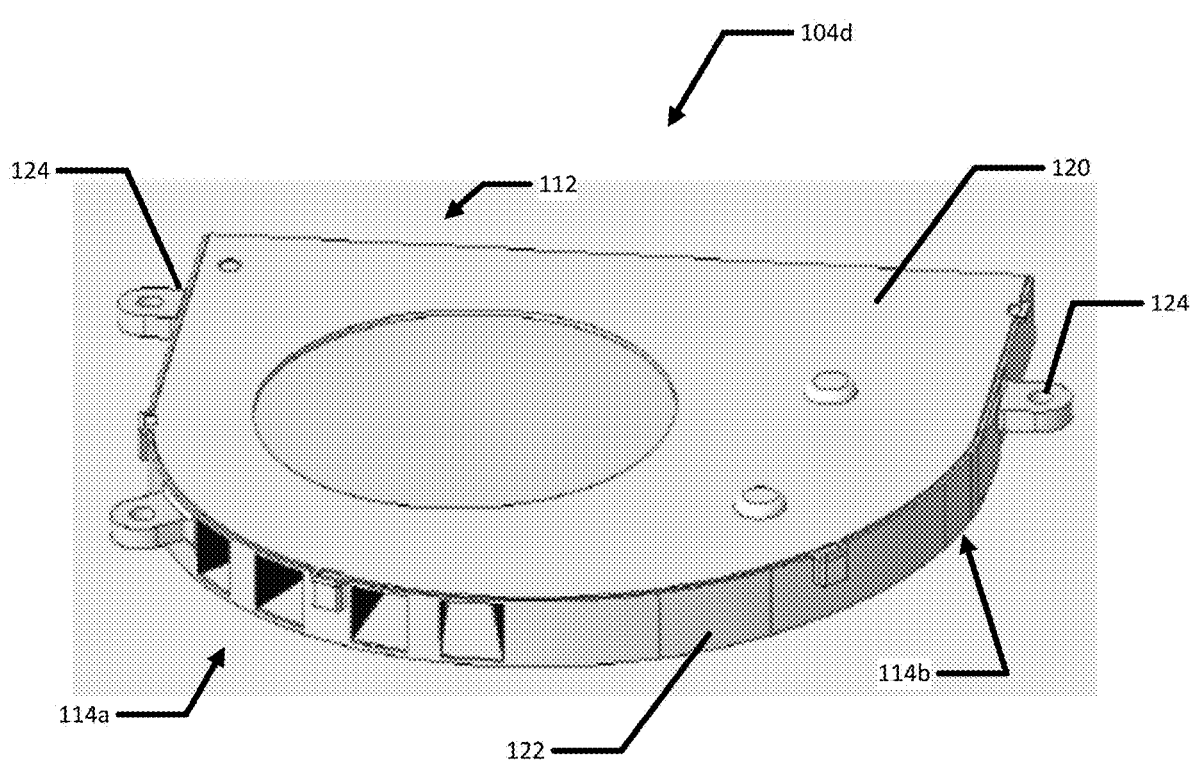
FIG. 3 is a simplified block diagram perspective view of a fan enclosure with adjustable side venting, in accordance with an embodiment of the present disclosure.

Turning to FIG. 3, FIG. 3 is a simplified perspective view of a block diagram of a fan enclosure with adjustable side venting 104d, in accordance with an embodiment of the present disclosure. In an example, the fan enclosure with adjustable side venting 104d can include the main vent 112, side vents 114a and 114b, the top cover 120, the main body 122, and attachment tabs 124. As illustrated in FIG. 3, the top cover 120 can be over the main body 122 to help protect the fan 108 (not shown) that is inside the fan enclosure with adjustable side venting 104*d* and to help force the air from the fan 108 out of the main vent 112 and any open side vents 114. For example, as illustrated in FIG. 3, the side vents 114*a* are open to allow the air from the fan 108 in the enclosure with adjustable side venting 104*d* to escape and help cool heat sources and/or hot spots near the side vents 114*a*. The side vents 114*b* can be closed to help increase the airflow out of the side vents 114*a*. The attachment tabs 118 can help secure the fan enclosure with adjustable side venting 104*d* to the chassis 116 (not shown) of the electronic device 100 (not shown).

Figure 4:
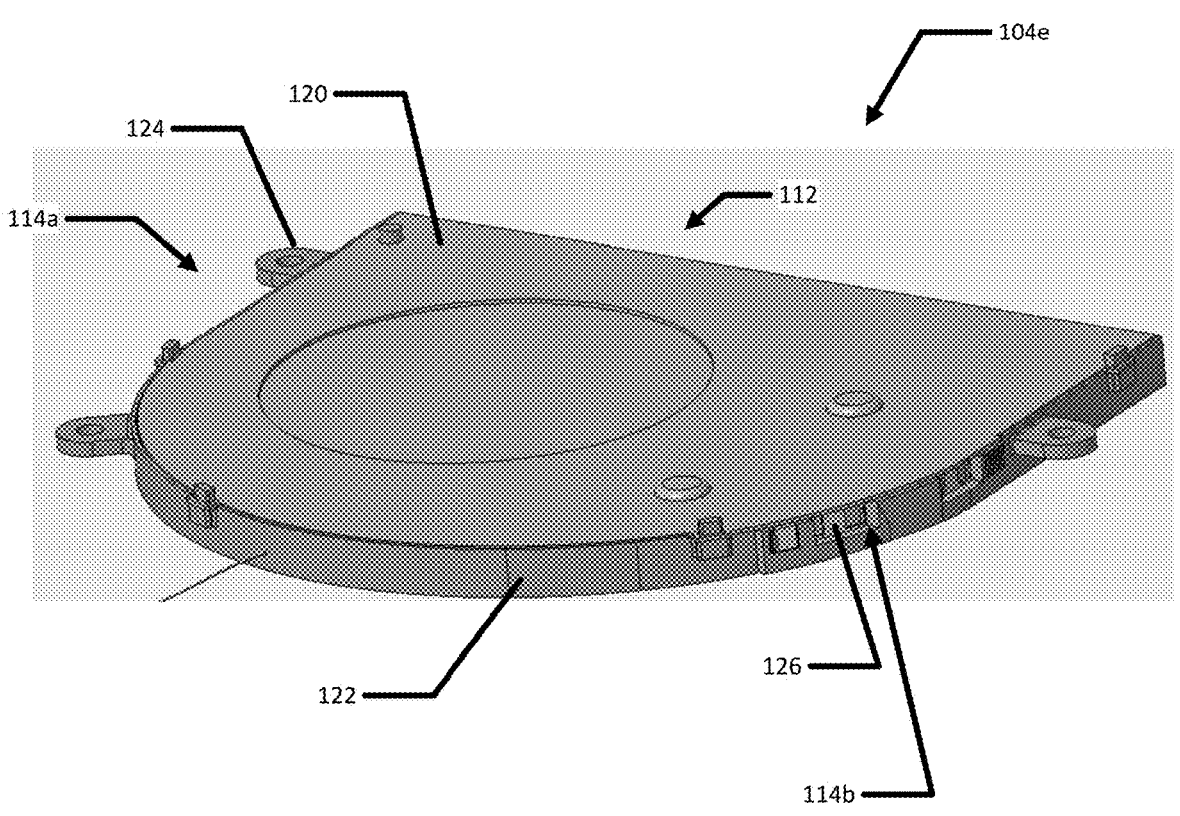
FIG. 4 is a simplified block diagram perspective view of a fan enclosure with adjustable side venting, in accordance with an embodiment of the present disclosure.

Turning to FIG. 4, FIG. 4 is a simplified perspective view of a block diagram of a fan enclosure with adjustable side venting 104*e*, in accordance with an embodiment of the present disclosure. In an example, the fan enclosure with adjustable side venting 104*e* can include the main vent 112, side vents 114*a* and 114*b*, the top cover 120, the main body 122, attachment tabs 124, and a slide mechanism 126. As illustrated in FIG. 4, the top cover 120 can be over the main body 122 to help protect the fan 108 (not shown) that is inside the fan enclosure with adjustable side venting 104*e* and to help force the air from the fan 108 out of the main vent 112 and any open the side vents 114. For example, as illustrated in FIG. 4, the side vents 114*b* are open to allow the air from the fan 108 in the enclosure with adjustable side venting 104*e* to escape and help cool heat sources and/or hot spots near the side vents 114*b*. The side vents 114*a* can be closed to help increase the airflow out of side vents 114*b*. The attachment tabs 118 can help secure the fan enclosure with adjustable side venting 104*e* to the chassis 116 (not shown) of the electronic device 100 (not shown). The slide mechanism 126 can be used to adjust the venting hole size of side vents 114*b* to adjust the volume of air flow out of side vents 114*b*. In some examples, the slide mechanism 126 can be used to close off one or more of the side vents 114*b*. For example, the slide mechanism 126 can be used to close the side vents 114*a*.

Figure 5:
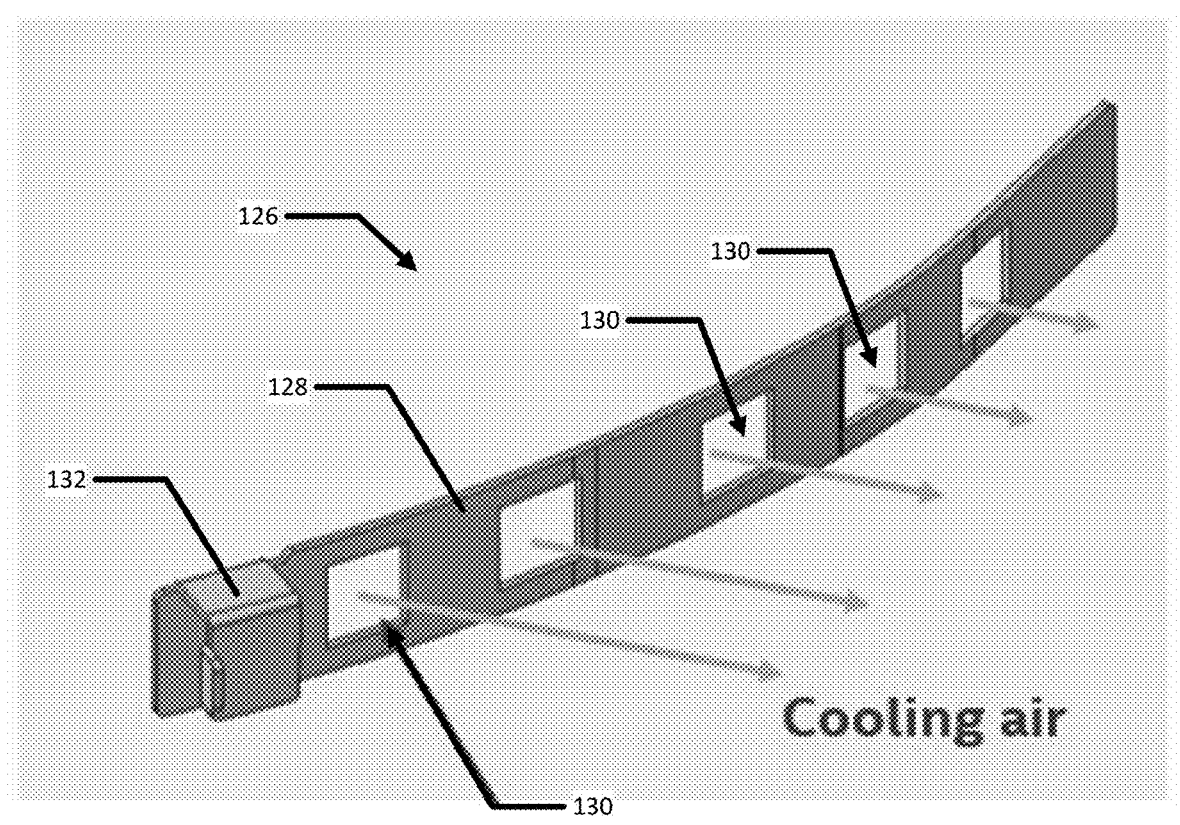
FIG. 5 is a simplified block diagram perspective view of a portion of a fan enclosure with adjustable side venting, in accordance with an embodiment of the present disclosure.

Turning to FIG. 5, FIG. 5 is a simplified perspective view of a block diagram of the slide mechanism 126, in accordance with an embodiment of the present disclosure. In an example, the slide mechanism 126 can include a main body 128, a plurality of windows 130, and slide/attachment mechanism 132. The windows 130 can allow air from the fan 108 (not shown) to pass through the main body 128. The slide/attachment mechanism 132 can extend perpendicularly from the main body 128 and provide a means of sliding the slide mechanism 126 into place or a tab or handle to allow a user or a tool or device to slide the slide mechanism 126 into place. The slide/attachment mechanism 132 can also help to secure the slide mechanism 126 once the slide mechanism 126 is positioned to a desired location.

Figure 6:
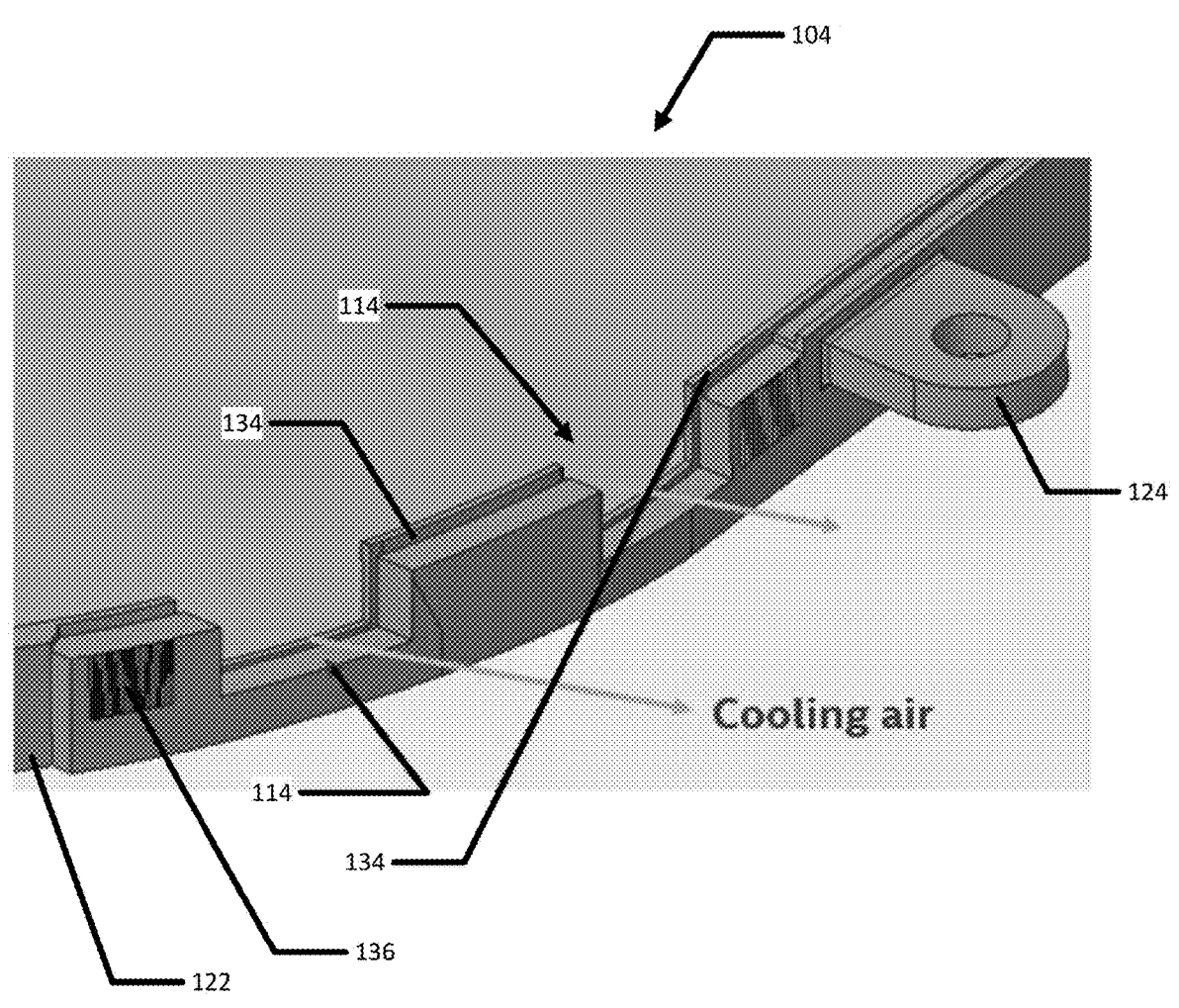
FIG. 6 is a simplified block diagram perspective view of a portion of a fan enclosure with adjustable side venting, in accordance with an embodiment of the present disclosure.

Turning to FIG. 6, FIG. 6 is a simplified perspective view of a block diagram of a portion of the fan enclosure with adjustable side venting 104, in accordance with an embodiment of the present disclosure. In an example, the fan enclosure with adjustable side venting 104 can include the main body 122. The main body 122 can include the plurality of side vents 114, the attachment tabs 124, a slide mechanism channel 134, and a slide mechanism attachment area 136.

Figure 7:
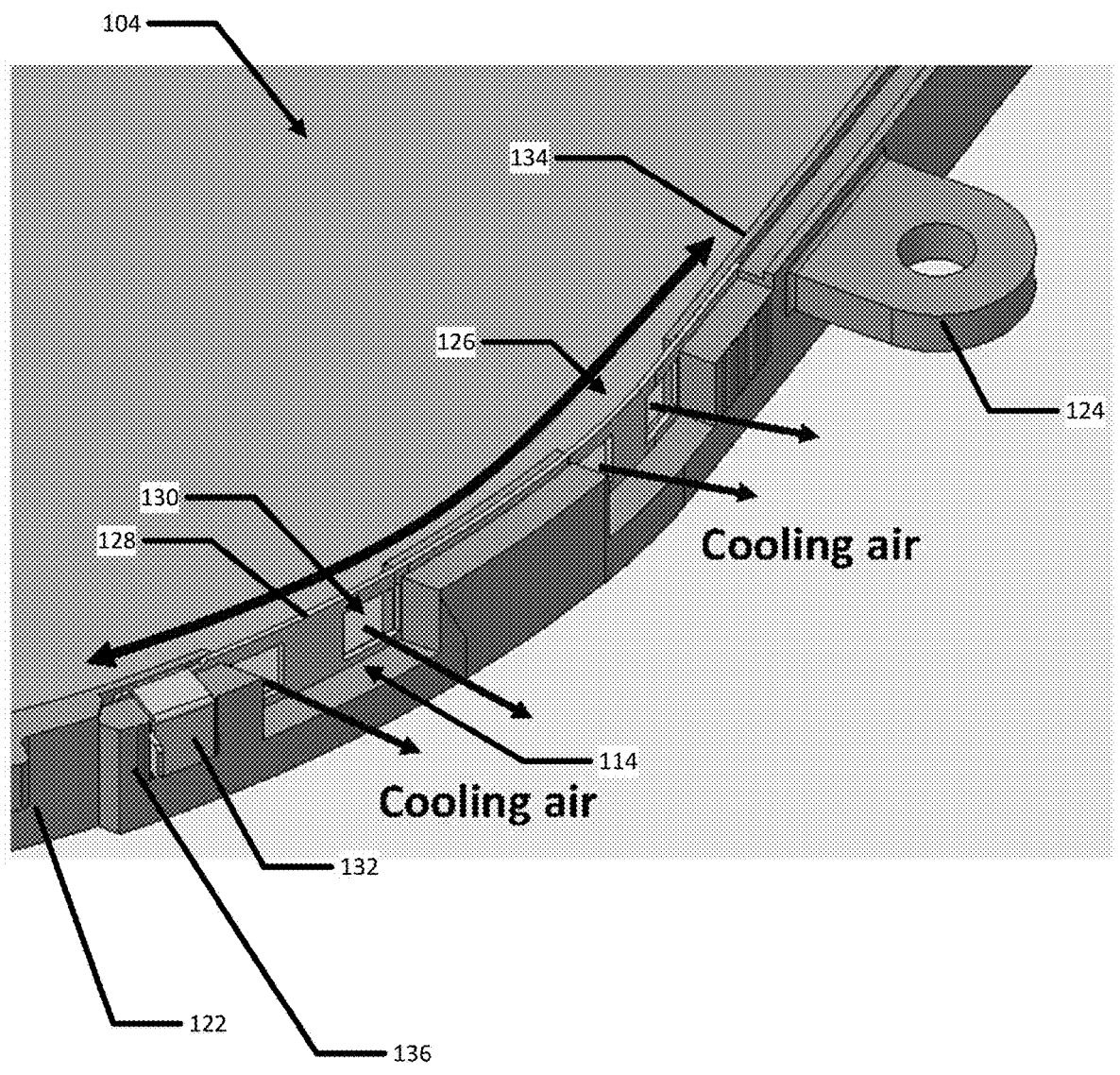
FIG. 7 is a simplified block diagram perspective view of a portion of a fan enclosure with adjustable side venting, in accordance with an embodiment of the present disclosure.

Turning to FIG. 7, FIG. 7 is a simplified perspective view of a block diagram of a portion of the fan enclosure with adjustable side venting 104, in accordance with an embodiment of the present disclosure. In an example, the fan enclosure with adjustable side venting 104 can include the main body 122 and the slide mechanism 126. The main body 122 can include the plurality of side vents 114, the attachment tabs 124, the slide mechanism channel 134, and the slide mechanism attachment area 136. The slide mechanism 126 can include the main body 128, the plurality of windows 130, and the slide/attachment mechanism 132.

During construction or assembly of the fan enclosure with adjustable side venting 104, the main body 128 of the slide mechanism 126 can be inserted into the slide mechanism channel 134. The slide mechanism 126 can move back and forth in the slide mechanism channel 134 to position the windows 130 of the slide mechanism 126 at a desired location to help create the desired air flow through the side vents 114 or line up the windows 130 of the slide mechanism 126 to help create the desired air flow through the side vents 114 and to control the amount of air from the side vents 114. For example, if a relatively large amount of air is desired to flow through the side vents 114, then as illustrated in FIG. 7, two of the windows 130 can be positioned to allow a relatively large amount of air to flow through the side vents 114. If a relatively small amount of air is desired to flow through the side vents 114, then only one of the windows 130 may be positioned in each of side vents 114 to allow a relatively small amount of air to flow through the side vents 114. The number of windows and position of the windows illustrated in FIG. 7 is for illustration purposes only and the number and position of windows depends on the desired amount of air to flow through the side vents 114 and design constrains. The slide/attachment mechanism 132 can help provide a means of sliding the slide mechanism 126 into place. The slide/attachment mechanism 132 can also help to secure the slide mechanism 126 to slide mechanism attachment area 136 and secure the slide mechanism 126 once the slide mechanism 126 is positioned to a desired location. The slide/attachment mechanism 132 can be secured to the slide mechanism attachment area 136 using friction or some other means that can secure the slide mechanism 126 in a desired location.

Figure 8:
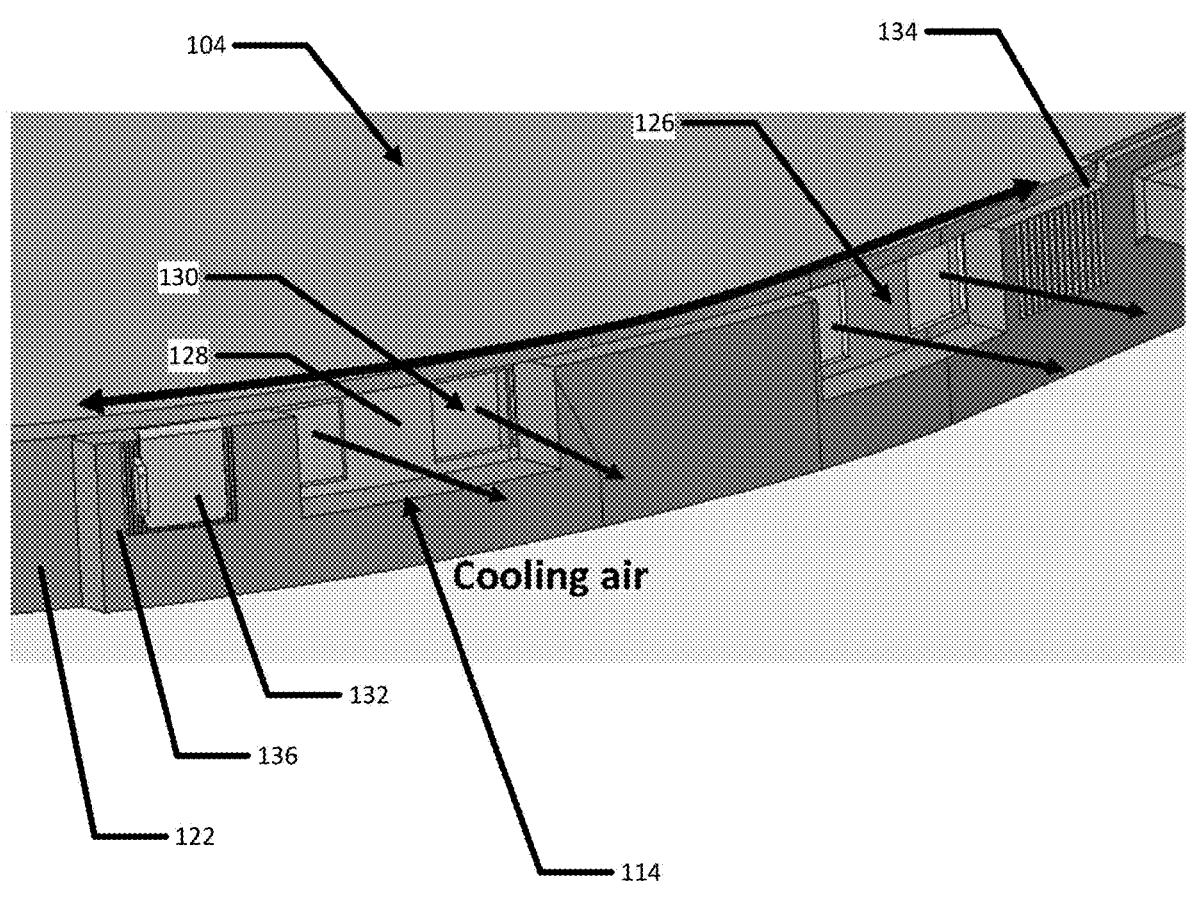
FIG. 8 is a simplified block diagram perspective view of a portion of a fan enclosure with adjustable side venting, in accordance with an embodiment of the present disclosure.

Turning to FIG. 8, FIG. 8 is a simplified perspective view of a block diagram of a portion of the fan enclosure with adjustable side venting 104, in accordance with an embodiment of the present disclosure. In an example, the fan enclosure with adjustable side venting 104 can include the main body 122 and the slide mechanism 126. The main body 122 can include the plurality of side vents 114, the slide mechanism channel 134, and the slide mechanism attachment area 136. The slide mechanism 126 can include the main body 128, the plurality of windows 130, and the slide/attachment mechanism 132.

During construction or assembly of the fan enclosure with adjustable side venting 104, the main body 128 of the slide mechanism 126 can be inserted into the slide mechanism channel 134. The slide mechanism 126 can move back and forth in the slide mechanism channel 134 to position the windows 130 of the slide mechanism 126 at a desired location to help create the desired air flow through the side vents 114. The number of windows and position of the windows illustrated in FIG. 8 is for illustration purposes only and the number and position of windows depends on the desired amount of air to flow through the side vents 114 and design constrains. The slide/attachment mechanism 132 can help provide a means of sliding the slide mechanism 126 into place. The slide/attachment mechanism 132 can also help to secure the slide mechanism 126 to slide mechanism attachment area 136 and secure the slide mechanism 126 once the slide mechanism 126 is positioned to a desired location.

Figure 9:
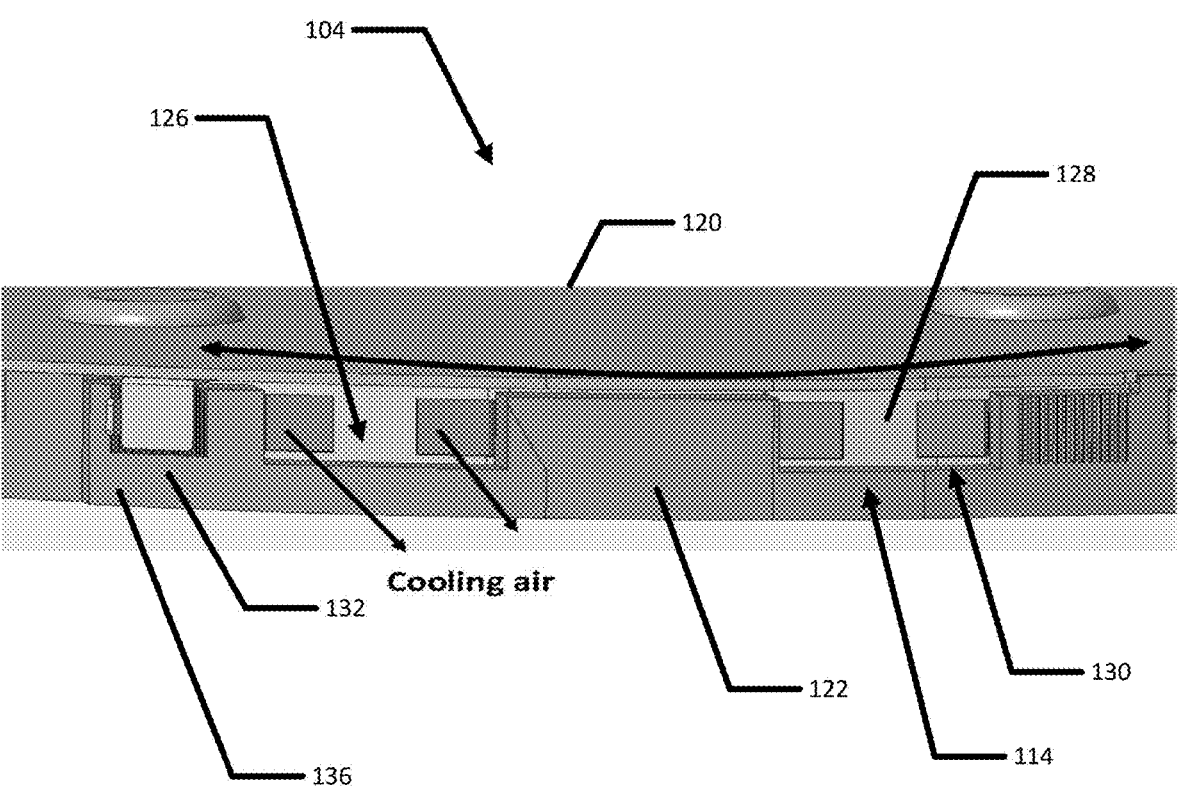
FIG. 9 is a simplified block diagram perspective view of a portion of a fan enclosure with adjustable side venting, in accordance with an embodiment of the present disclosure.

Turning to FIG. 9, FIG. 9 is a simplified perspective front view of a block diagram of a portion of the fan enclosure with adjustable side venting 104, in accordance with an embodiment of the present disclosure. In an example, the fan enclosure with adjustable side venting 104 can include the main body 122, the slide mechanism 126, and top cover 120. The main body 122 can include the plurality of side vents 114, the slide mechanism channel 134 (not shown), and the slide mechanism attachment area 136. The slide mechanism 126 can include the main body 128, the plurality of windows 130, and the slide/attachment mechanism 132.

During construction or assembly of the fan enclosure with adjustable side venting 104, the main body 128 of the slide mechanism 126 can be inserted into the slide mechanism channel 134. The slide mechanism 126 can move back and forth in the slide mechanism channel 134 to position the windows 130 of the slide mechanism 126 at a desired location to help create the desired air flow through the side vents 114. The number of windows and position of the windows illustrated in FIG. 9 is for illustration purposes only and the number and position of windows depends on the desired amount of air to flow through the side vents 114 and design constrains. The slide/attachment mechanism 132 can help provide a means of sliding the slide mechanism 126 into place. The slide/attachment mechanism 132 can also help to secure the slide mechanism 126 to slide mechanism attachment area 136 and secure the slide mechanism 126 once the slide mechanism 126 is positioned to a desired location. In some examples, the slide mechanism 126 can be positioned to the desired location and secured in place even with the top cover 120 over the main body 122 of the fan enclosure with adjustable side venting 104.

Figure 10:
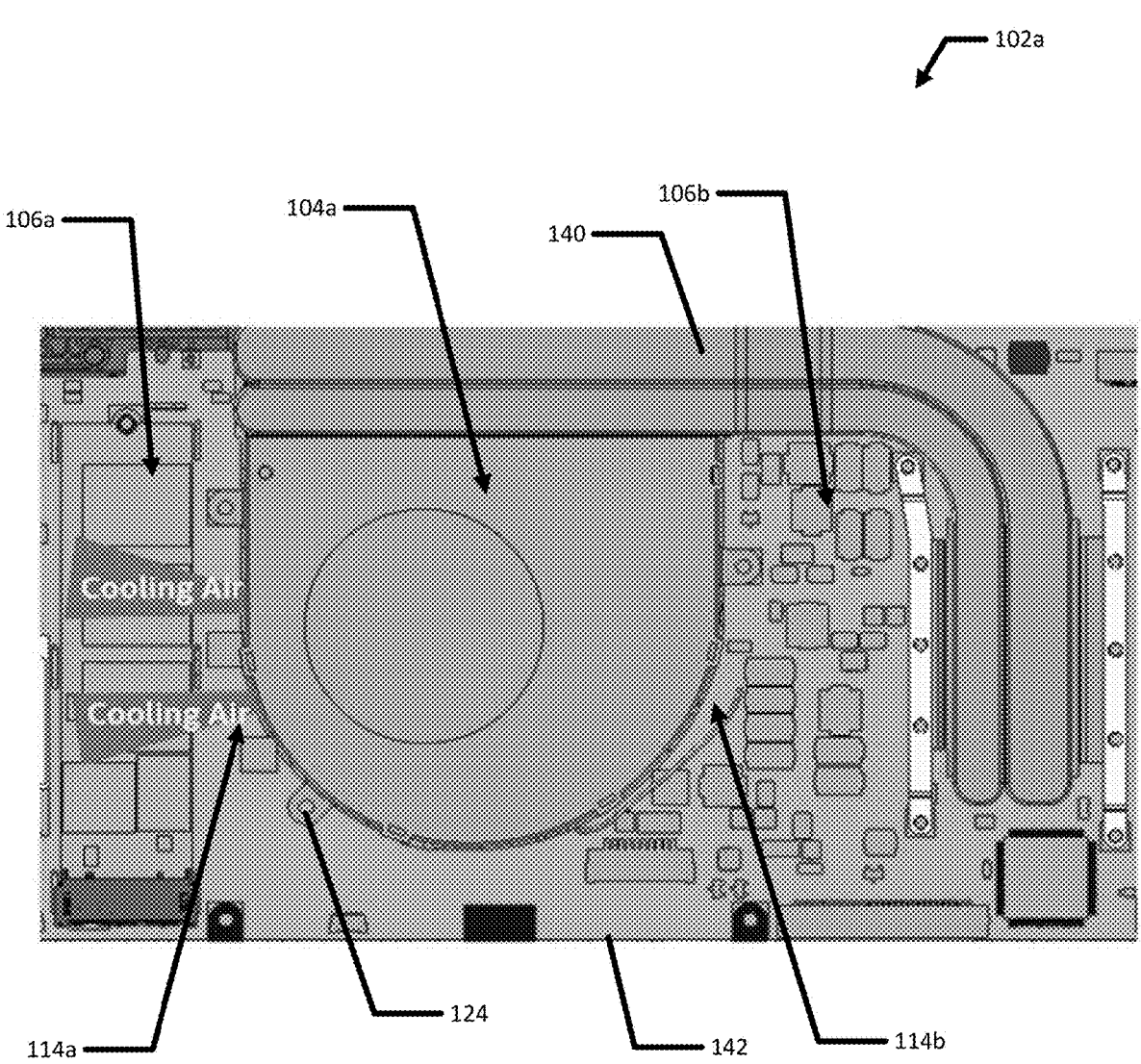
FIG. 10 is a simplified block diagram of a portion of a system that includes a fan enclosure with adjustable side venting, in accordance with an embodiment of the present disclosure.

Turning to FIG. 10, FIG. 10 is a simplified a block diagram of a portion of the electronic device 102a, in accordance with an embodiment of the present disclosure. In an example, the electronic device 102a can include fan enclosure with adjustable side venting 104a, the first heat sources 106a, the second heat sources 106b, and one or more heat pipes 140. The fan enclosure with adjustable side venting 104a can include side vents 114a and 114b and attachment tabs 124. In an example, attachment tabs 124 can help to secure the fan enclosure with adjustable side venting 104a to a support structure 142. The first heat sources 106a and the second heat sources 106b can also be coupled to the support structure 142. The support structure 142 can be a printed circuit board or substrate. The heat pipe 140 can help to remove heat and cool down one or more components (e.g., a CPU or a GPU) in electronic device 102a. As illustrated in FIG. 10, the heat pipe is not over the first heat sources 106a and the second heat sources 106b. If it is determined that the first heat sources 106a need additional cooling, the side vents 114a can allow the air from the fan in the enclosure with adjustable side venting 104a to be directed towards the first heat sources 106a and help cool the first heat sources 106a heat sources and hot spots near the side vents 114a. The side vents 114b can be closed the help increase the airflow out of side vents 114a.

Figure 11:
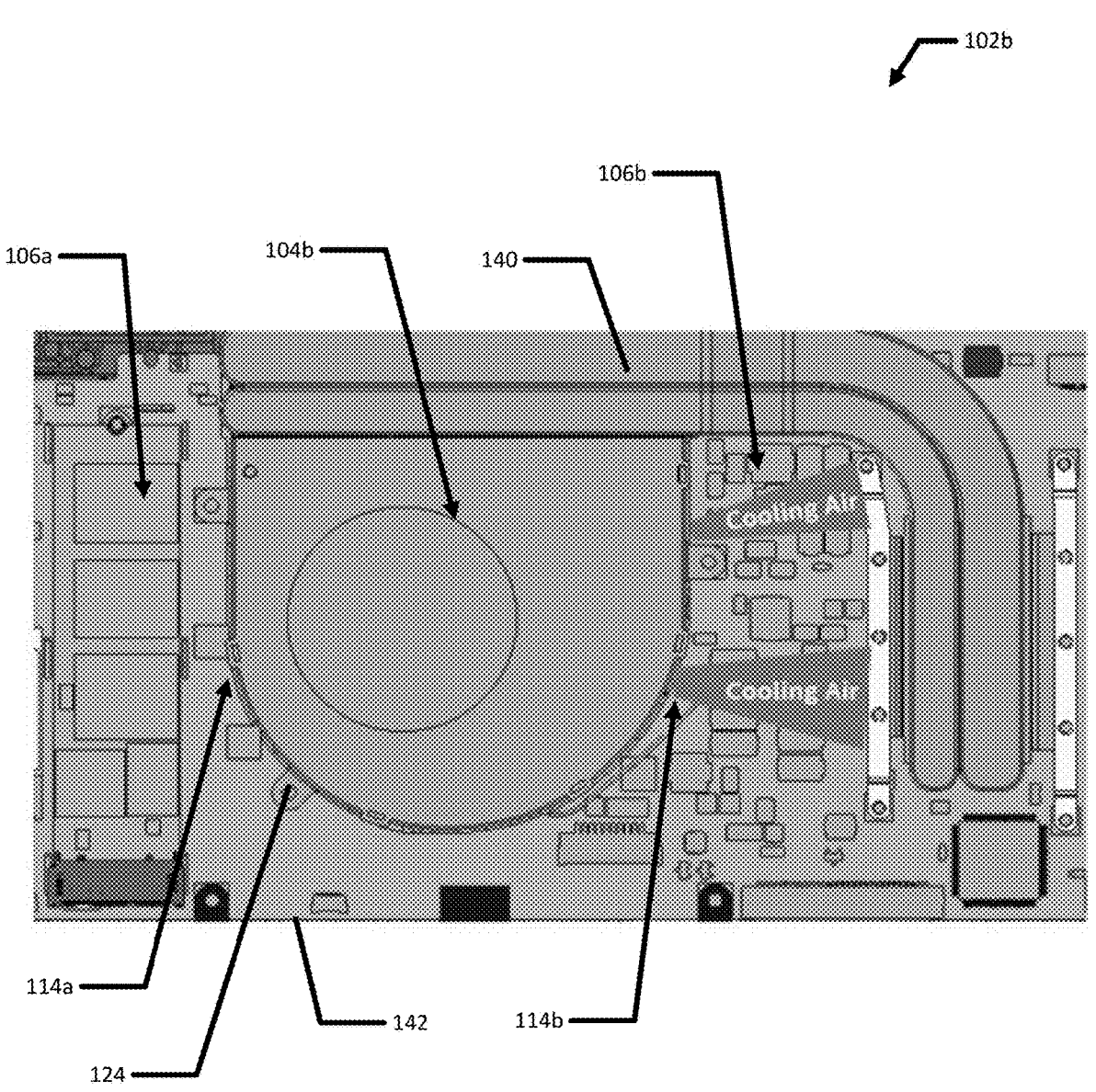
FIG. 11 is a simplified block diagram of a portion of a system that includes a fan enclosure with adjustable side venting, in accordance with an embodiment of the present disclosure.

Turning to FIG. 11, FIG. 11 is a simplified a block diagram of a portion of the electronic device 102b, in accordance with an embodiment of the present disclosure. In an example, the electronic device 102b can include fan enclosure with adjustable side venting 104b, the first heat sources 106a, the second heat sources 106b, and one or more heat pipes 140. The fan enclosure with adjustable side venting 104b can include side vents 114a and 114b and attachment tabs 124. In an example, attachment tabs 124 can help to secure the fan enclosure with adjustable side venting 104b to the support structure 142. The first heat sources 106a and the second heat sources 106b can also be coupled to the support structure 142. The heat pipe 140 can help to remove heat and cool down one or more components (e.g., a CPU or a GPU) in electronic device 102b. As illustrated in FIG. 11, the heat pipe is not over the first heat sources 106a and the second heat sources 106b. If it is determined that the second heat sources 106b need additional cooling, the side vents 114b can allow the air from the fan in the enclosure with adjustable side venting 104b to be directed towards the second heat sources 106b and help cool the second heat sources 106b heat sources and hot spots near the side vents 114b. The side vents 114a can be closed the help increase the airflow out of side vents 114b.

Figure 12:
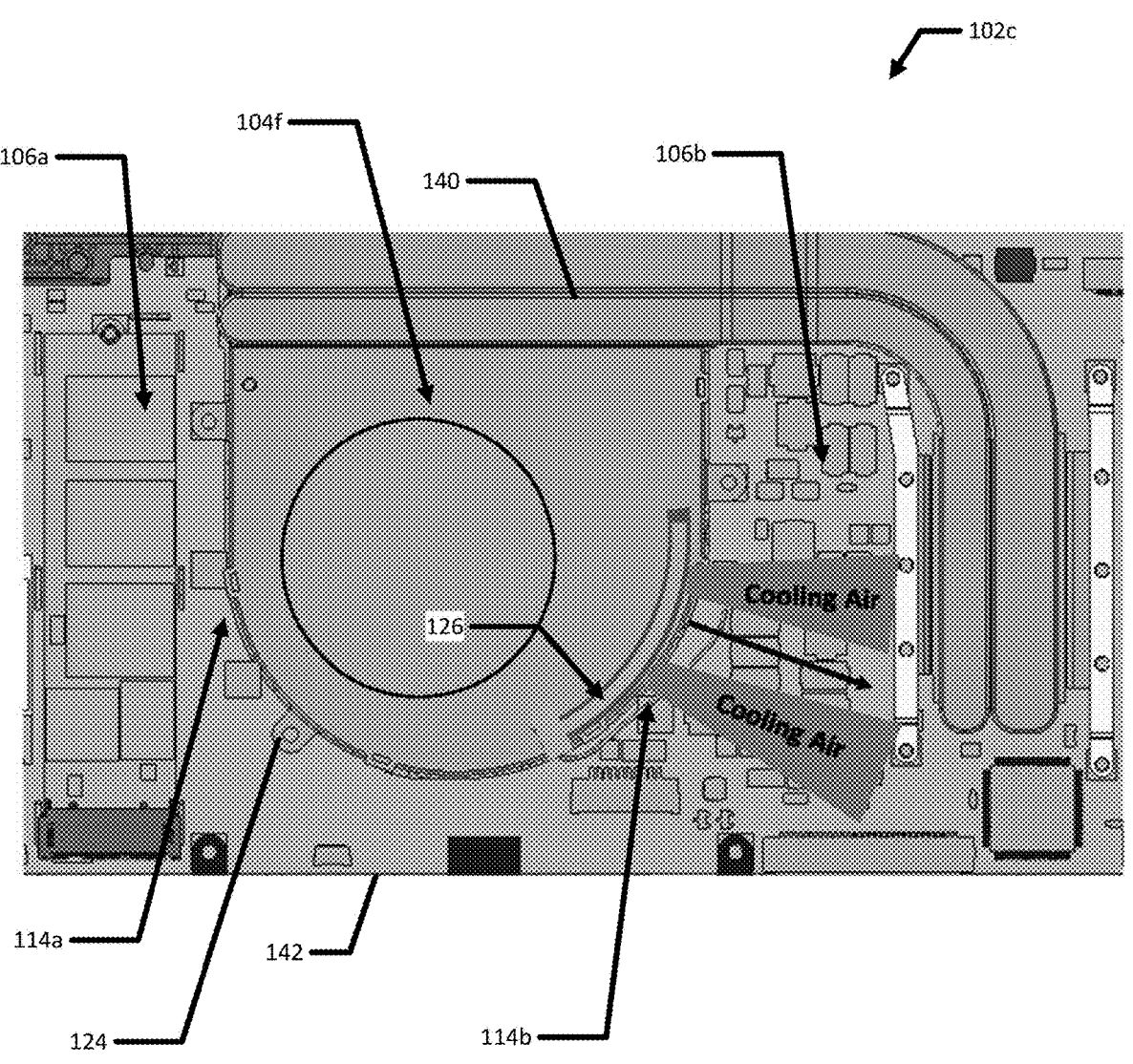
FIG. 12 is a simplified block diagram of a portion of a system that includes a fan enclosure with adjustable side venting, in accordance with an embodiment of the present disclosure.

Turning to FIG. 12, FIG. 12 is a simplified a block diagram of a portion of an electronic device 102c, in accordance with an embodiment of the present disclosure. In an example, the electronic device 102c can include fan enclosure with adjustable side venting 104f, the first heat sources 106a, the second heat sources 106b, and one or more heat pipes 140. The fan enclosure with adjustable side venting 104f can include side vents 114a and 114b, attachment tabs 124, and slide mechanism 126. In an example, attachment tabs 124 can help to secure the fan enclosure with adjustable side venting 104f to the support structure 142. The first heat sources 106a and the second heat sources 106b can also be coupled to the support structure 142. The heat pipe 140 can help to remove heat and cool down one or more components (e.g., a CPU or a GPU) in electronic device 102c. As illustrated in FIG. 12, the heat pipe is not over the first heat sources 106a and the second heat sources 106b. If it is determined that the second heat sources 106b need additional cooling, the slide mechanism 126 can be positioned such that the side vents 114b can allow the air from the fan in the enclosure with adjustable side venting 104f to be directed towards the second heat sources 106b and help cool the second heat sources 106b heat sources and hot spots near the side vents 114b. The side vents 114a can be closed the help increase the airflow out of side vents 114b. In some examples, the slide mechanism 126 can be positioned to direct the focus of the airflow out of side vents 114b. For examples, as illustrated in FIG. 12, the airflow out of side vents 114b is in a first direction (as opposed to a second direction illustrated in FIG. 13 described below).

Figure 13:
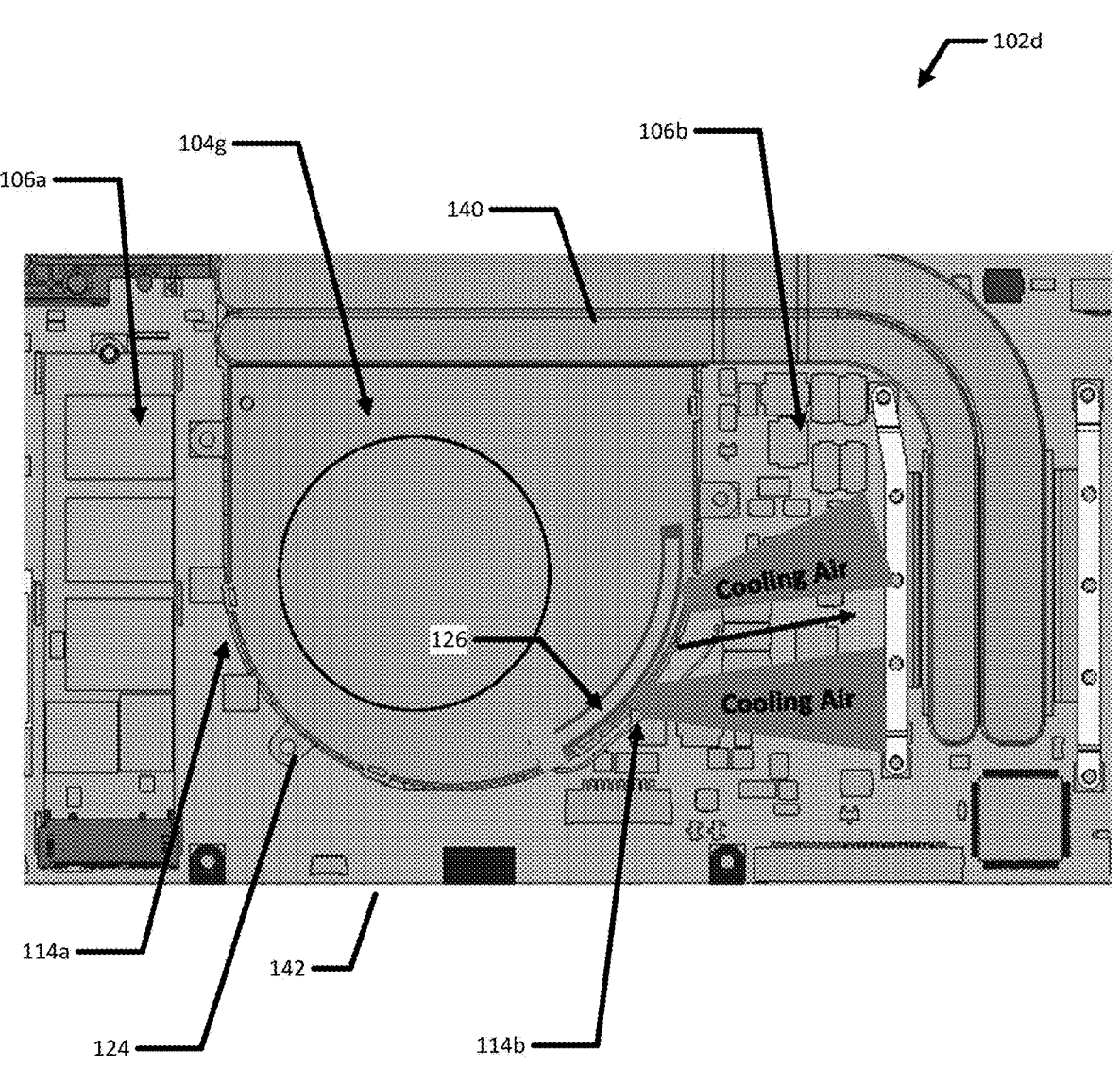
FIG. 13 is a simplified block diagram of a portion of a system that includes a fan enclosure with adjustable side venting, in accordance with an embodiment of the present disclosure.

Turning to FIG. 13, FIG. 13 is a simplified a block diagram of a portion of an electronic device 102d, in accordance with an embodiment of the present disclosure. In an example, the electronic device 102d can include fan enclosure with adjustable side venting 104g, the first heat sources 106a, the second heat sources 106b, and one or more heat pipes 140. The fan enclosure with adjustable side venting 104g can include side vents 114a and 114b, attachment tabs 124, and slide mechanism 126. In an example, attachment tabs 124 can help to secure the fan enclosure with adjustable side venting 104g to the support structure 142. The first heat sources 106a and the second heat sources 106b can also be coupled to the support structure 142. The heat pipe 140 can help to remove heat and cool down one or more components (e.g., a CPU or a GPU) in electronic device 102d. As illustrated in FIG. 13, the heat pipe is not over the first heat sources 106a and the second heat sources 106b. If it is determined that the second heat sources 106b need additional cooling, the slide mechanism 126 can be positioned such that the side vents 114b can allow the air from the fan in the enclosure with adjustable side venting 104g to be directed towards the second heat sources 106b and help cool the second heat sources 106b heat sources and hot spots near the side vents 114b. The side vents 114a can be closed the help increase the airflow out of side vents 114b. In some examples, the slide mechanism 126 can positioned to direct the focus of the airflow out of side vents 114b. For examples, as illustrated in FIG. 13, the airflow out of side vents 114b is in a second direction (as opposed to a first direction illustrated in FIG. 12 described above).

Figure 14:
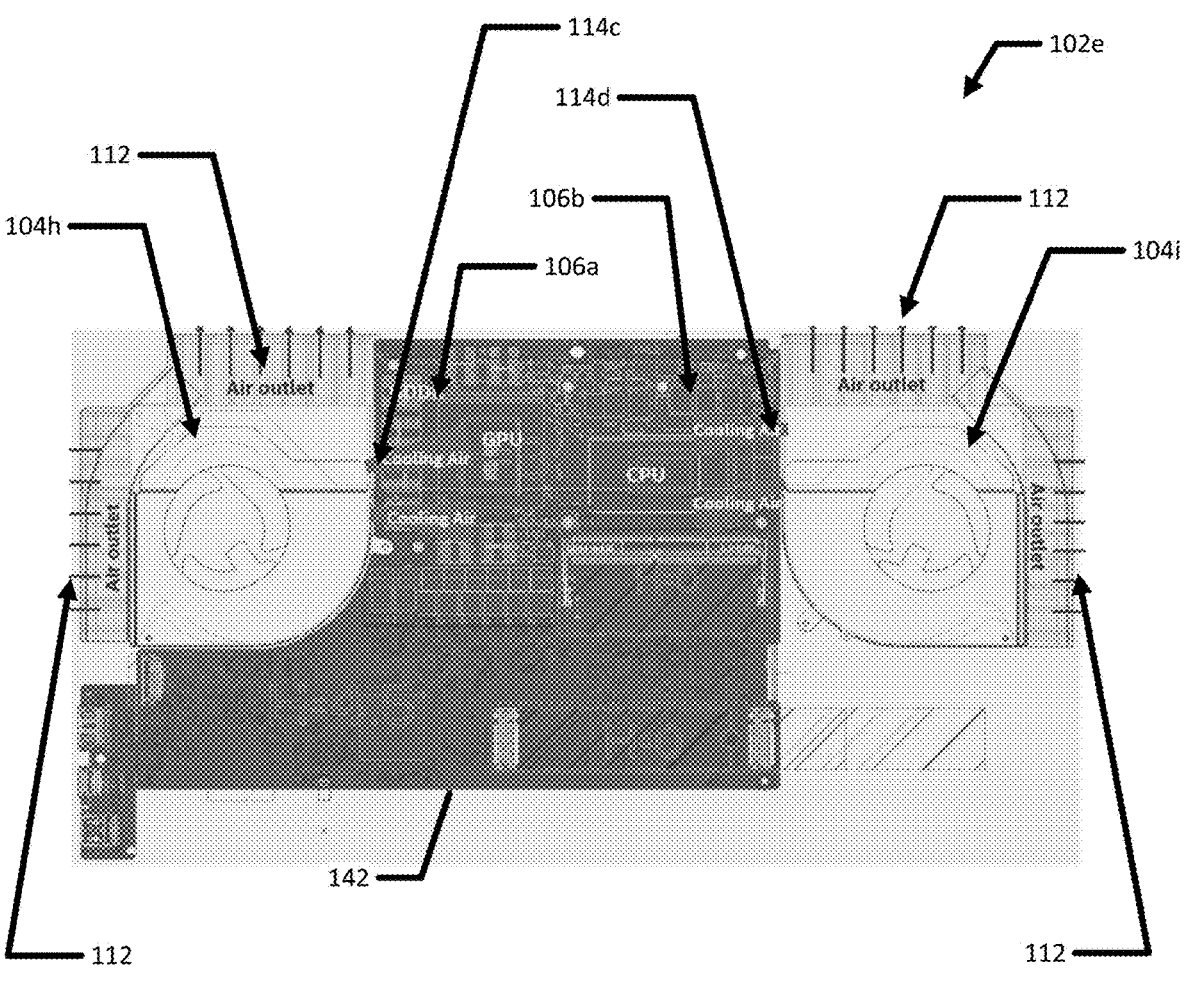
FIG. 14 is a simplified block diagram of a portion of a system that includes a fan enclosure with adjustable side venting, in accordance with an embodiment of the present disclosure.

Turning to FIG. 14, FIG. 14 is a simplified a block diagram of a portion of an electronic device 102e, in accordance with an embodiment of the present disclosure. In an example, the electronic device 102e can include a fan enclosure with adjustable side venting 104h, a fan enclosure with adjustable side venting 104i, the first heat sources 106a and the second heat sources 106b. The fan enclosure with adjustable side venting 104h, the fan enclosure with adjustable side venting 104i, the first heat sources 106a, and the second heat sources 106b can be on support structure 142. The fan enclosure with adjustable side venting 104h can include side vents 114c and one or more main vents 112. The side vents 114c can allow the air from the fan 108 (not shown) in the enclosure with adjustable side venting 104h to be directed towards the first heat sources 106a and help cool the first heat sources 106a heat sources and hot spots near the side vents 114c. The fan enclosure with adjustable side venting 104i can include side vents 114d and one or more main vents 112. The side vents 114d can allow the air from the fan 108 (not shown) in the enclosure with adjustable side venting 104i to be directed towards the second heat sources 106b and help cool the second heat sources 106b heat sources and hot spots near the side vents 114d.

Figure 15:
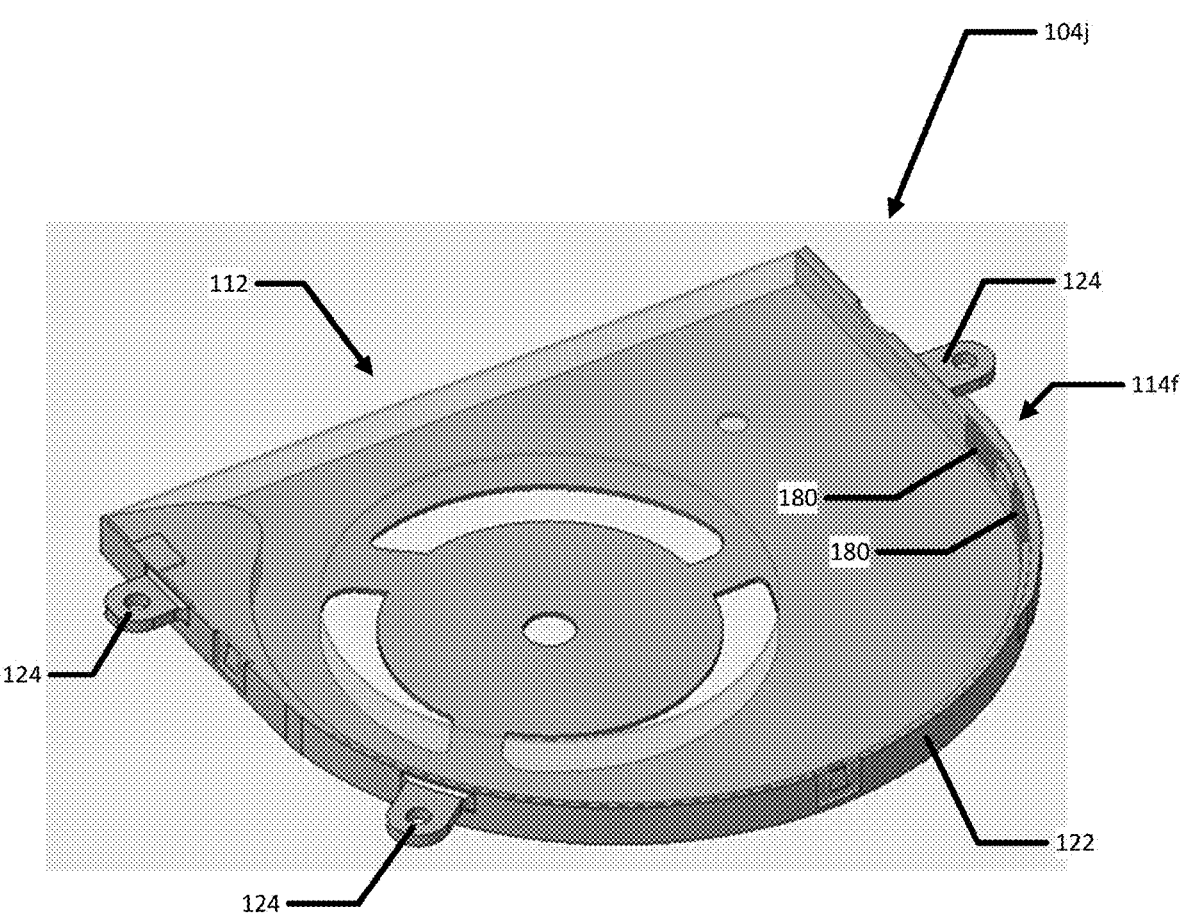
FIG. 15 is a simplified block diagram perspective view of a portion of a fan enclosure with adjustable side venting, in accordance with an embodiment of the present disclosure.

Turning to FIG. 15, FIG. 15 is a simplified perspective view of a block diagram of a portion of the fan enclosure with adjustable side venting 104j, in accordance with an embodiment of the present disclosure. In an example, the fan enclosure with adjustable side venting 104j can include the main body 122. The main body 122 can include the main vent 112 (or the vent area for the main vent), the plurality of side vents 114f, and the attachment tabs 124.

During construction or assembly of the fan enclosure with adjustable side venting 104j, one or more side vent plugs 180 can be inserted into one or more of the pluralities of side vents 114f to help create the desired air flow through the side vents 114f. For example, as illustrated in FIG. 15, two of the side vent plugs 180 have been inserted into two of the side vents 114f. The number of the side vents 114f and the side vent plugs 180 illustrated in FIG. 15 is for illustration purposes only and the number and position of the side vents 114f and the side vent plugs 180 depends on the desired amount of air to flow through the side vents 114f and design constrains.

Figure 16:
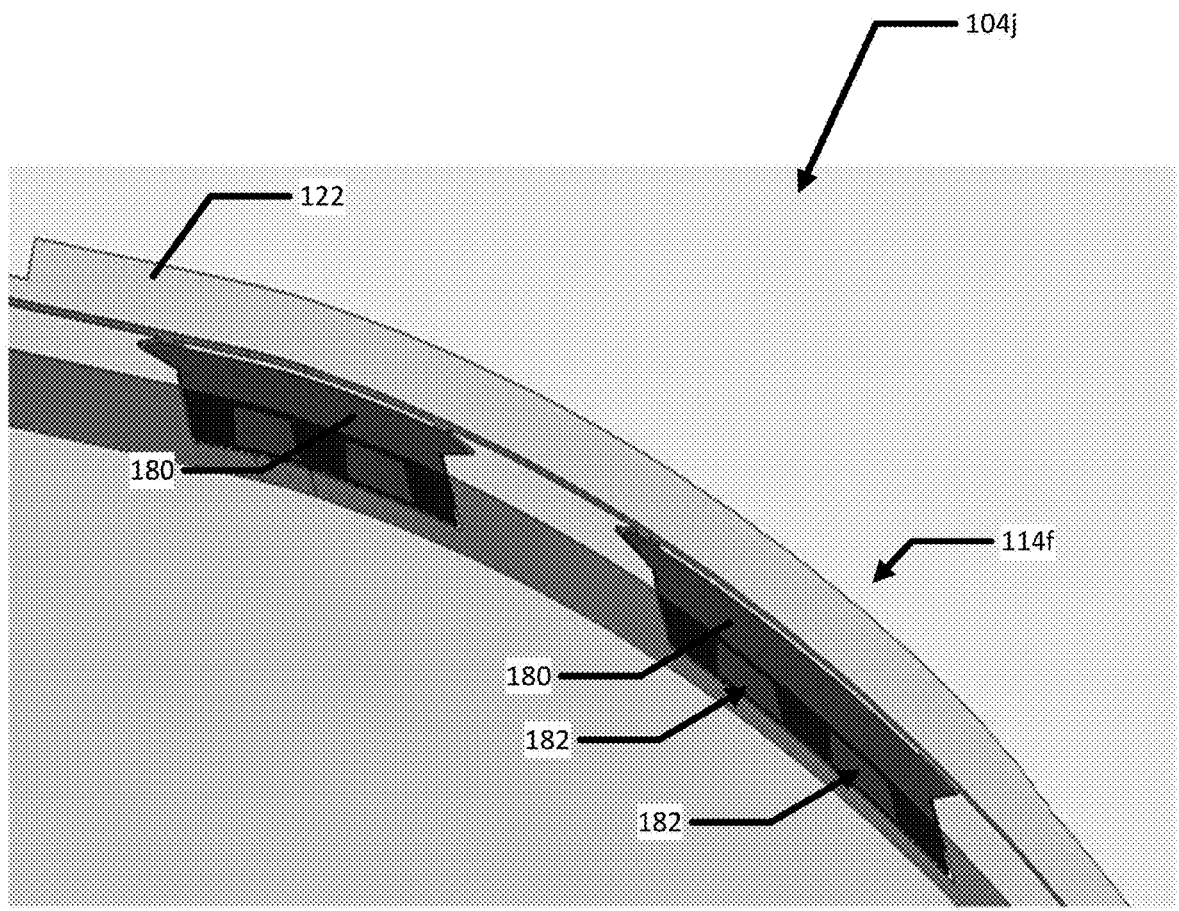
FIG. 16 is a simplified block diagram perspective view of a portion of a fan enclosure with adjustable side venting, in accordance with an embodiment of the present disclosure.

Turning to FIG. 16, FIG. 16 is a simplified perspective view of a block diagram of a portion of the fan enclosure with adjustable side venting 104j, in accordance with an embodiment of the present disclosure. In an example, the fan enclosure with adjustable side venting 104j can include the main body 122. The main body 122 can include the plurality of side vents 114f. During construction or assembly of the fan enclosure with adjustable side venting 104j, one or more side vent plugs 180 can be inserted into one or more of the pluralities of side vents 114f to help create the desired air flow through the side vents 114f. The side vent plugs 180 can include one or more plug windows 182 to help create the desired air flow through the side vents 114f. For example, as illustrated in FIG. 16, two of the side vent plugs 180 have been inserted into two of the side vents 114f. Each of the side vent plugs 180 have two plug windows 182. The size and shape of the plug windows 182 can depend on the size and shape that will create the desired air flow through the side vents 114f. The number of the side vents 114f, the side vent plugs 180, and plug windows 182 illustrated in FIG. 16 is for illustration purposes only and the number and position of the side vents 114f, the side vent plugs 180, and plug windows 182 depends on the desired amount of air to flow through the side vents 114f and design constrains.

Figure 17A:
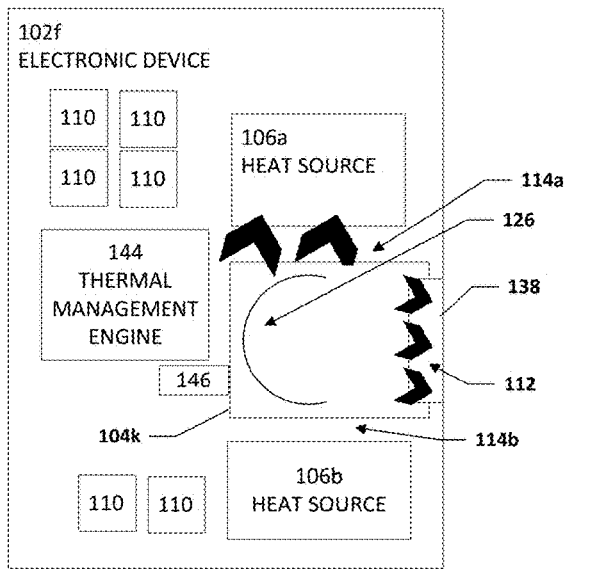
FIGS. 17A and 17B are a simplified block diagram of a system to enable a fan enclosure with adjustable side venting, in accordance with an embodiment of the present disclosure.
Figure 17B:
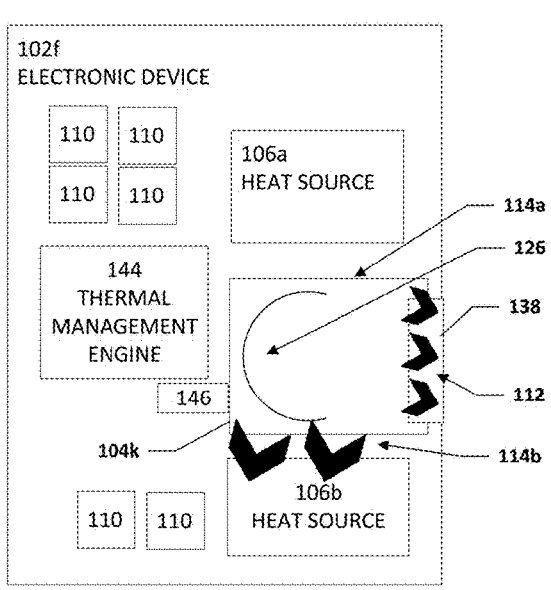

Turning to FIGS. 17A and 17B, FIGS. 17A and 17B are a simplified a block diagram of an electronic device 102f, in accordance with an embodiment of the present disclosure. In an example, the electronic device 102f can include a fan enclosure with adjustable side venting 104k, the one or more first heat sources 106a, the one or more second heat sources 106b, one or more electronic components 110, a thermal management engine 144, and a slide mechanism engine 146. The fan enclosure with adjustable side venting 104k can include the main vent 112, the plurality of side vents 114, and the slide mechanism 126.

The thermal management engine 144 can be configured to collect data or thermal parameters related to the first heat sources 106a and the second heat sources 106b and other components, elements, devices (e.g., electronic components 110) in electronic device 102f. The term "thermal parameters" includes a measurement, range, indicator, etc. of an element or condition that affects the thermal response, thermal state, and/or thermal transient characteristics of the heat source associated with the thermal parameters. The thermal parameters can include a temperature of a specific heat source, the air temperature (e.g., ambient air temperature, temperature of the air inside the platform, etc.), power dissipation of a heat source, a platform workload intensity, a CPU workload or processing speed, a data workload of a neighboring device, fan speed, or other indicators that may affect the thermal condition of a heat source. Based on the collect data or thermal parameters related to the first heat sources 106a and the second heat sources 106b and other components, the thermal management engine 144 can cause the slide mechanism engine 146 to move slide mechanism 126 and open or close the side vents 114 to control the air from the fan enclosure with adjustable side venting 104k. For example, if the thermal management engine 144 determines that the first heat sources 106a need to cool down, the thermal management engine 144 can cause the slide mechanism engine 146 to move slide mechanism 126 to open the side vents 114a to allow the air from the fan 108 (not shown) in the enclosure with adjustable side venting 104k to escape and help cool heat sources and/or hot spots near the side vents 114a, as illustrated in FIG. 17A. In another example, if the thermal management engine 144 determines that the second heats sources 106b need to cool down, the thermal management engine 144 can cause the slide mechanism engine 146 to move slide mechanism 126 to open side vents 114b to allow the air from the fan in the enclosure with adjustable side venting 104k to escape and help cool heat sources and/or hot spots near the side vents 114b, as illustrated in FIG. 17B.

Figure 18:
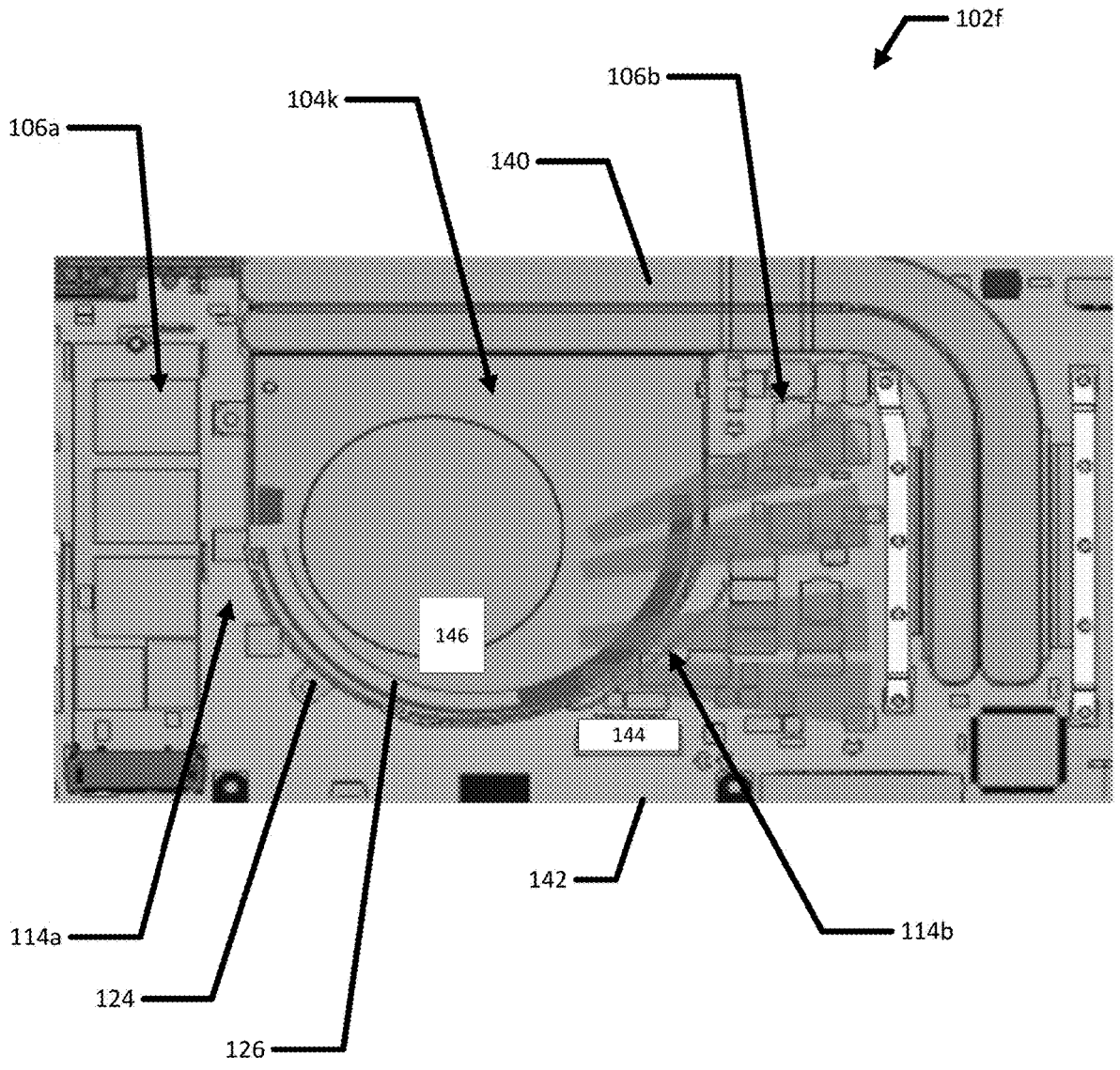
FIG. 18 is a simplified block diagram of a system that includes a fan enclosure with adjustable side venting, in accordance with an embodiment of the present disclosure.

Turning to FIG. 18, FIG. 18 is a simplified a block diagram of an electronic device 102f, in accordance with an embodiment of the present disclosure. In an example, the electronic device 102f can include the fan enclosure with adjustable side venting 104k, the one or more first heat sources 106a, the one or more second heat sources 106b, the thermal management engine 144, and the slide mechanism engine 146. The fan enclosure with adjustable side venting 104*k* can include the plurality of side vents 114, the attachment tabs 124, and the slide mechanism 126. The attachment tabs 124 can help secure the fan enclosure with adjustable side venting 104*k* to the support structure 142.

Based on the collect data or thermal parameters related to the first heat sources 106*a* and the second heat sources 106*b* and other components, the thermal management engine 144 can cause the slide mechanism engine 146 to move slide mechanism 126 and open or close the side vents 114 to control the air from the fan enclosure with adjustable side venting 104*k*. For example, if the thermal management engine 144 determines that the second heats sources 106*b* need to cool down, the thermal management engine 144 can cause the slide mechanism engine 146 to move slide mechanism 126 to open side vents 114*b* to allow the air from the fan 108 (not shown) in the enclosure with adjustable side venting 104*k* to escape and help cool heat sources and/or hot spots near the side vents 114*b*.

Figure 19:
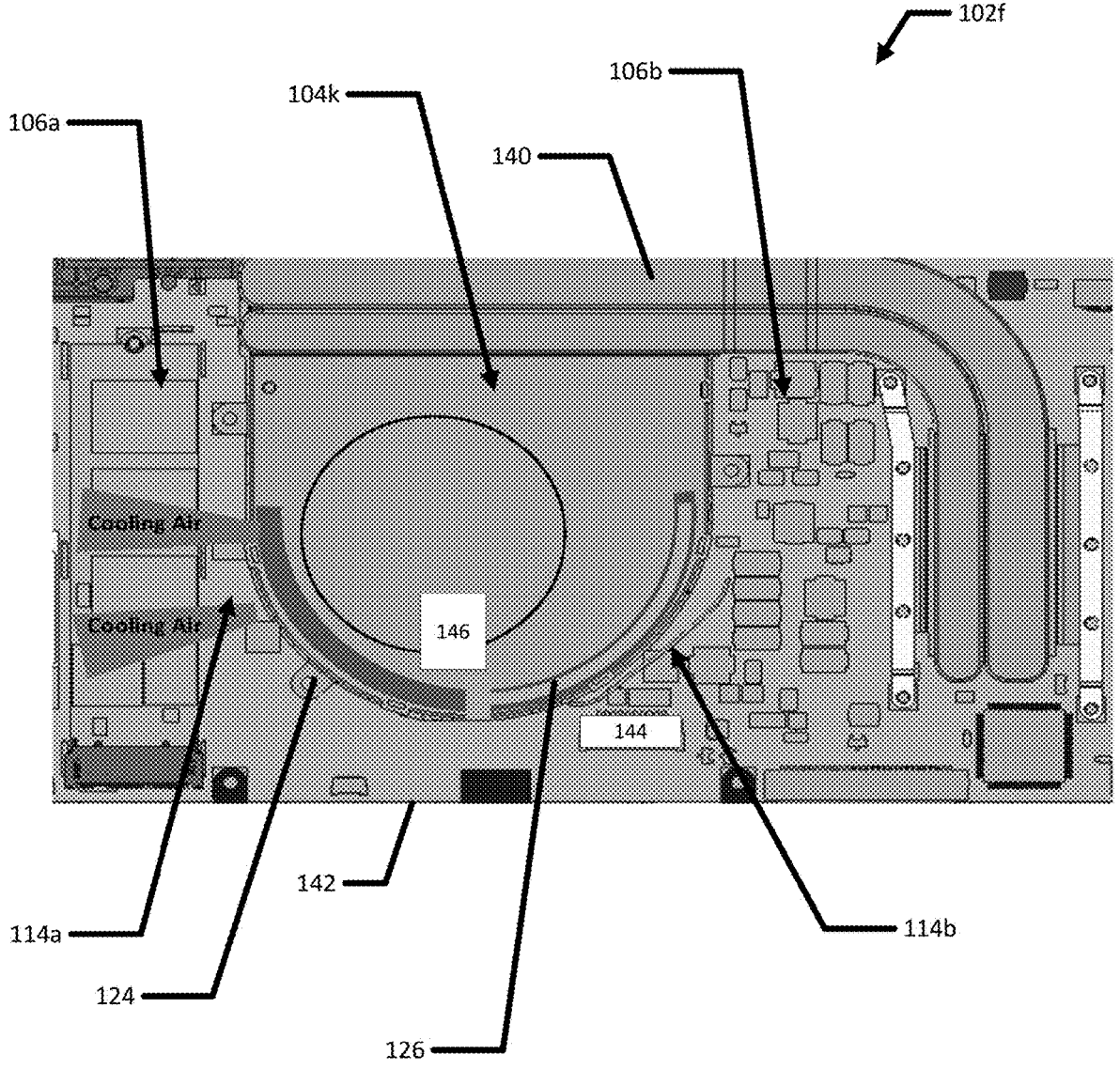
FIG. 19 is a simplified block diagram of a system that includes a fan enclosure with adjustable side venting, in accordance with an embodiment of the present disclosure.

Turning to FIG. 19, FIG. 19 is a simplified a block diagram of an electronic device 102*f*, in accordance with an embodiment of the present disclosure. In an example, the electronic device 102*f* can include the fan enclosure with adjustable side venting 104*k*, the one or more first heat sources 106*a*, the one or more second heat sources 106*b*, the thermal management engine 144, and the slide mechanism engine 146. The fan enclosure with adjustable side venting 104*k* can include the plurality of side vents 114, the attachment tabs 124, and the slide mechanism 126. The attachment tabs 124 can help secure the fan enclosure with adjustable side venting 104*k* to the support structure 142.

Based on the collect data or thermal parameters related to the first heat sources 106*a* and the second heat sources 106*b* and other components, the thermal management engine 144 can cause the slide mechanism engine 146 to move slide mechanism 126 and open or close the side vents 114 to control the air from the fan enclosure with adjustable side venting 104*k*. For example, if the thermal management engine 144 determines that the first heats sources 106*a* need to cool down, the thermal management engine 144 can cause the slide mechanism engine 146 to move slide mechanism 126 to open side vents 114*a* to allow the air from the fan 108 (not shown) in the enclosure with adjustable side venting 104*k* to escape and help cool heat sources and/or hot spots near the side vents 114*a*.

Figure 20:
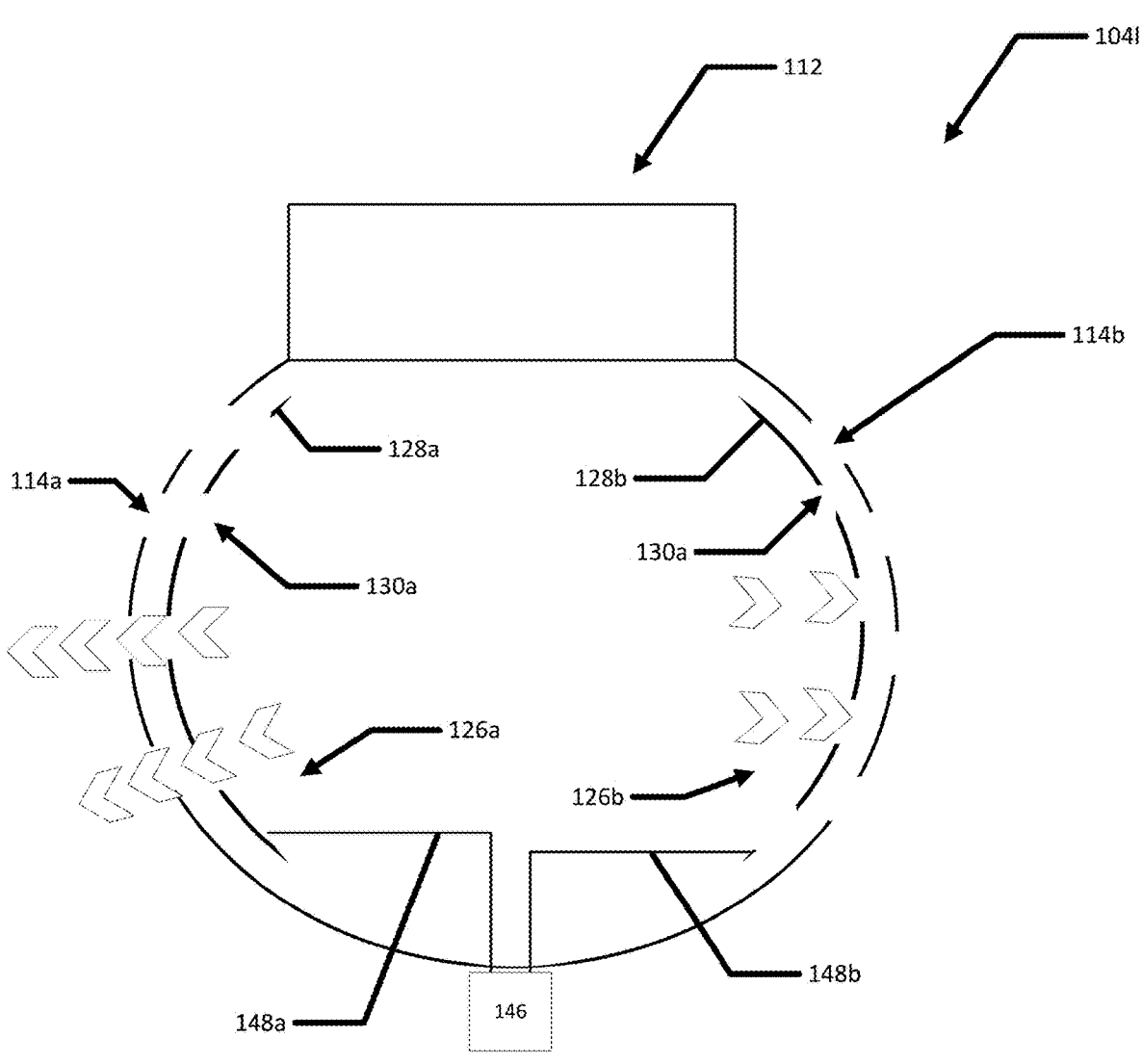
FIG. 20 is a simplified block diagram of a portion of a fan enclosure with adjustable side venting, in accordance with an embodiment of the present disclosure.

Turning to FIG. 20, FIG. 20 is a simplified a block diagram of a fan enclosure with adjustable side venting 104*l*, in accordance with an embodiment of the present disclosure. In an example, the fan enclosure with adjustable side venting 104*l*, can include the side vents 114*a* and 114*b*, a first slide mechanism 126*a*, and a second slide mechanism 126*b*. The first slide mechanism 126*a* can include a main body 128*a* and a plurality of windows 130*a*. The second slide mechanism 126*b* can include a main body 128*b* and a plurality of windows 130*b*. The slide mechanism engine 146 can be connected to the first slide mechanism 126*a* and the second slide mechanism 126*b* to move the first slide mechanism 126*a* and/or the second slide mechanism 126*b* to control the air flow out of side vents 114*a* and 114*b*.

For example, as illustrated in FIG. 20, the windows 130*a* in the main body 128*a* of the first slide mechanism 126*a* line up with the side vents 114*a* to allow air to flow out of the side vents 114*a* and help cool heat sources and/or hot spots near the side vents 114*a*. Also, as illustrated in FIG. 20, the windows 130*b* in the main body 128*b* of the second slide mechanism 126*b* do not line up with the side vents 114*b* and do not allow air to flow out of the side vents 114*b*. The slide mechanism engine 146 can be connected to the first slide mechanism 126*a* using a first actuator 148*a* and can be connected to the second slide mechanism 126*b* using a second actuator 148*b*. The first actuator 148*a* and the second actuator 148*b* may be a mechanical actuator, an electrical actuator, or some other type of mechanism that can move the first slide mechanism 126*a* and the second slide mechanism 126*b*, respectively. Note that the spacing in FIG. 20 is for illustration purposes only and is not drawn to scale.

Figure 21:
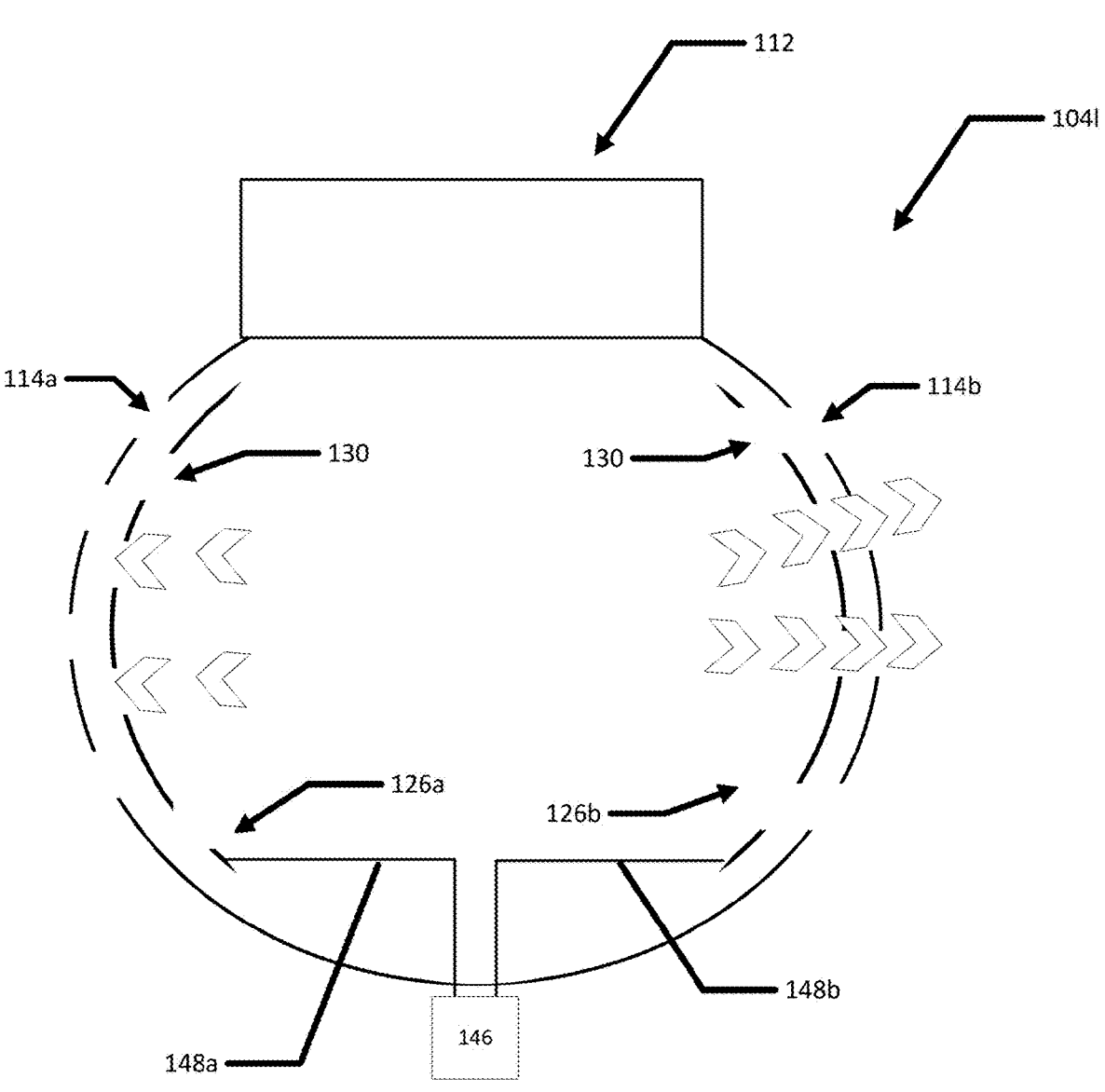
FIG. 21 is a simplified block diagram of a portion of a fan enclosure with adjustable side venting, in accordance with an embodiment of the present disclosure.

Turning to FIG. 21, FIG. 21 is a simplified a block diagram of the fan enclosure with adjustable side venting 104*l*, in accordance with an embodiment of the present disclosure. In an example, the fan enclosure with adjustable side venting 104*l*, can include the side vents 114*a* and 114*b*, the first slide mechanism 126*a*, and the second slide mechanism 126*b*. The first slide mechanism 126*a* can include the main body 128*a* and the plurality of windows 130*a*. The second slide mechanism 126*b* can include the main body 128*b* and the plurality of windows 130*b*. The slide mechanism engine 146 can be connected to the first slide mechanism 126*a* and the second slide mechanism 126*b* to move the first slide mechanism 126*a* and/or the second slide mechanism 126*b* to control the air flow out of side vents 114*a* and 114*b*.

For example, as illustrated in FIG. 21, the windows 130*a* in the main body 128*a* of the first slide mechanism 126*a* do not line up with the side vents 114*a* and do not allow air to flow out of the side vents 114*a*. Also, as illustrated in FIG. 21, the windows 130*b* in the main body 128*b* of the second slide mechanism 126*b* line up with the side vents 114*b* to allow air to flow out of the side vents 114*b* and help cool heat sources and/or hot spots near the side vents 114*b*. Note that the spacing in FIG. 21 is for illustration purposes only and is not drawn to scale.

Figure 22:
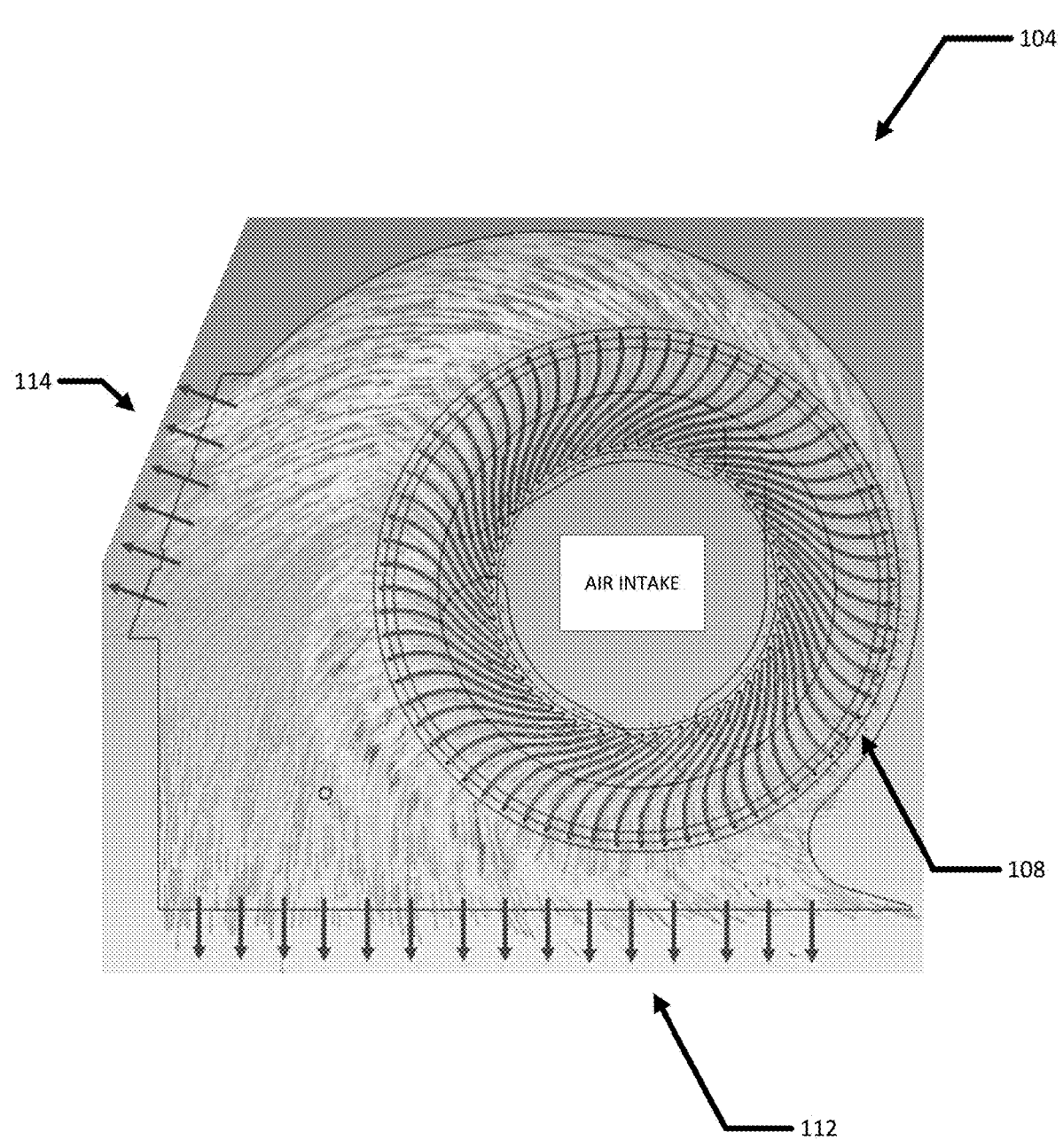
FIG. 22 is a simplified block diagram of a portion of a fan enclosure with adjustable side venting, in accordance with an embodiment of the present disclosure.

Turning to FIG. 22, FIG. 22 is a simplified a block diagram of a portion of the fan enclosure with adjustable side venting 104, in accordance with an embodiment of the present disclosure. In an example, as the fan 108 rotates, air can be drawn into a middle portion or area of the fan enclosure with adjustable side venting 104. The air that was drawn in can then exit the fan enclosure with adjustable side venting 104 through the main vent(s) 112 and the side vent(s) 114.

Figure 23:
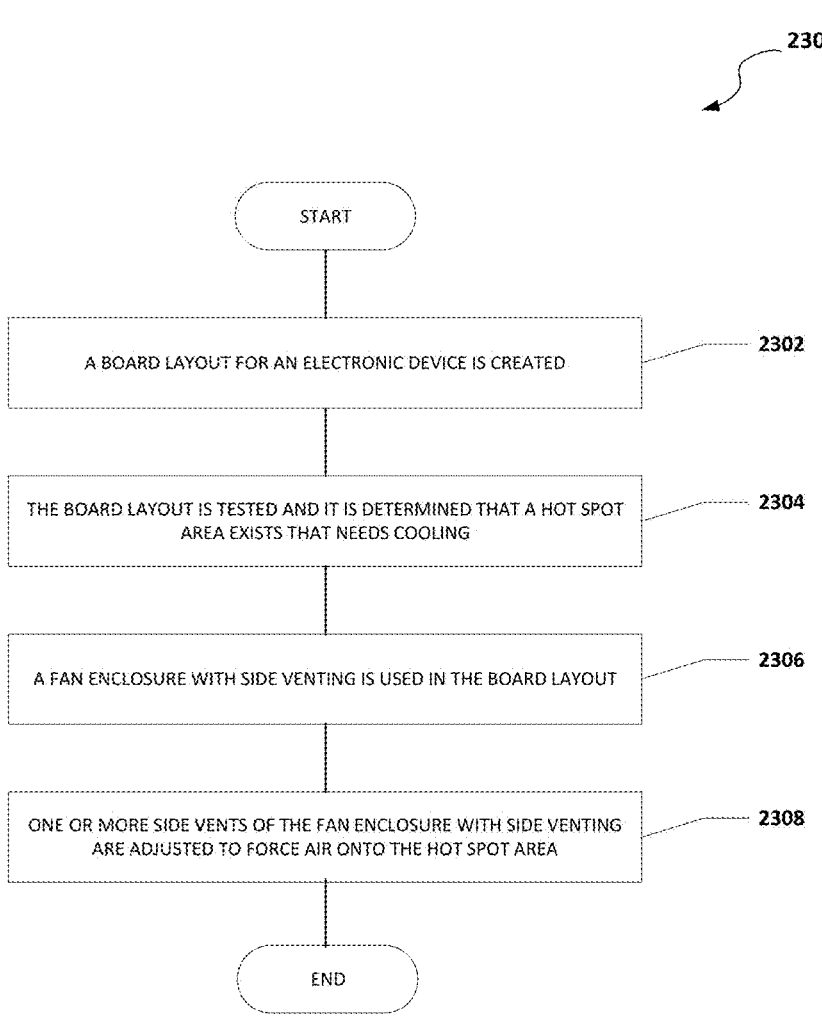
FIG. 23 is a simplified flowchart illustrating potential operations that may be associated with the system in accordance with an embodiment of the present disclosure.

Turning to FIG. 23, FIG. 23 is an example flowchart illustrating possible operations of a flow 2300 that may be associated with creating a fan enclosure with adjustable side venting, in accordance with an embodiment. At 2302, a board layout for an electronic device is created. At 2304, the board layout is tested, and it is determined that a hot spot area exists that needs cooling. The hot spot area can be a heat source (e.g., processor, logic unit, field programmable gate array (FPGA), chip set, integrated circuit (IC), a graphics processor, graphics card, battery, memory, or some other type of heat generating device) or an area around a heat source. At 2306, a fan enclosure with side venting is used in the board layout. In an example, the fan enclosure with side venting is used to replace a fan that was used in the board layout that does not have side venting. At 2308, one or more side vents of the fan enclosure with side venting are adjusted to force air onto the hot spot area. For example, a slide mechanism can be used to adjust the venting hole size of side vents to adjust the volume of air flow out of the side vents. In another example, one or more of the side vent plugs 180 can be used to adjust the venting hole size of side vents to adjust the volume of air flow out of side vents. In an example, the slide mechanism, the side vent plugs, or some other means may be used during manufacturing to adjust the size and quantity of open side vents in the fan enclosure with adjustable side venting 104 and to direct airflow from the side vents to the identified hot spots in the component layout.

Turning to FIG. 24, FIG. 24 is an example flowchart illustrating possible operations of a flow 2400 that may be associated with creating a fan enclosure with adjustable side venting, in accordance with an embodiment. At 2402, a thermal management engine in an electronic device determines that a hot spot in an electronic device needs to be cooled down. The hot spot can be a heat source (e.g., processor, logic unit, field programmable gate array (FPGA), chip set, integrated circuit (IC), a graphics processor, graphics card, battery, memory, or some other type of heat generating device) or an area around a heat source. At 2404, the thermal management engine causes a slide mechanism engine to move a slide mechanism in a fan enclosure with adjustable side venting. At 2406, the slide mechanism engine moves the slide mechanism and causes the air flow out of the fan enclosure with adjustable side venting to change. At 2408, the air flow out of the fan enclosure with adjustable side venting is directed to the hot spot.

Figure 25:
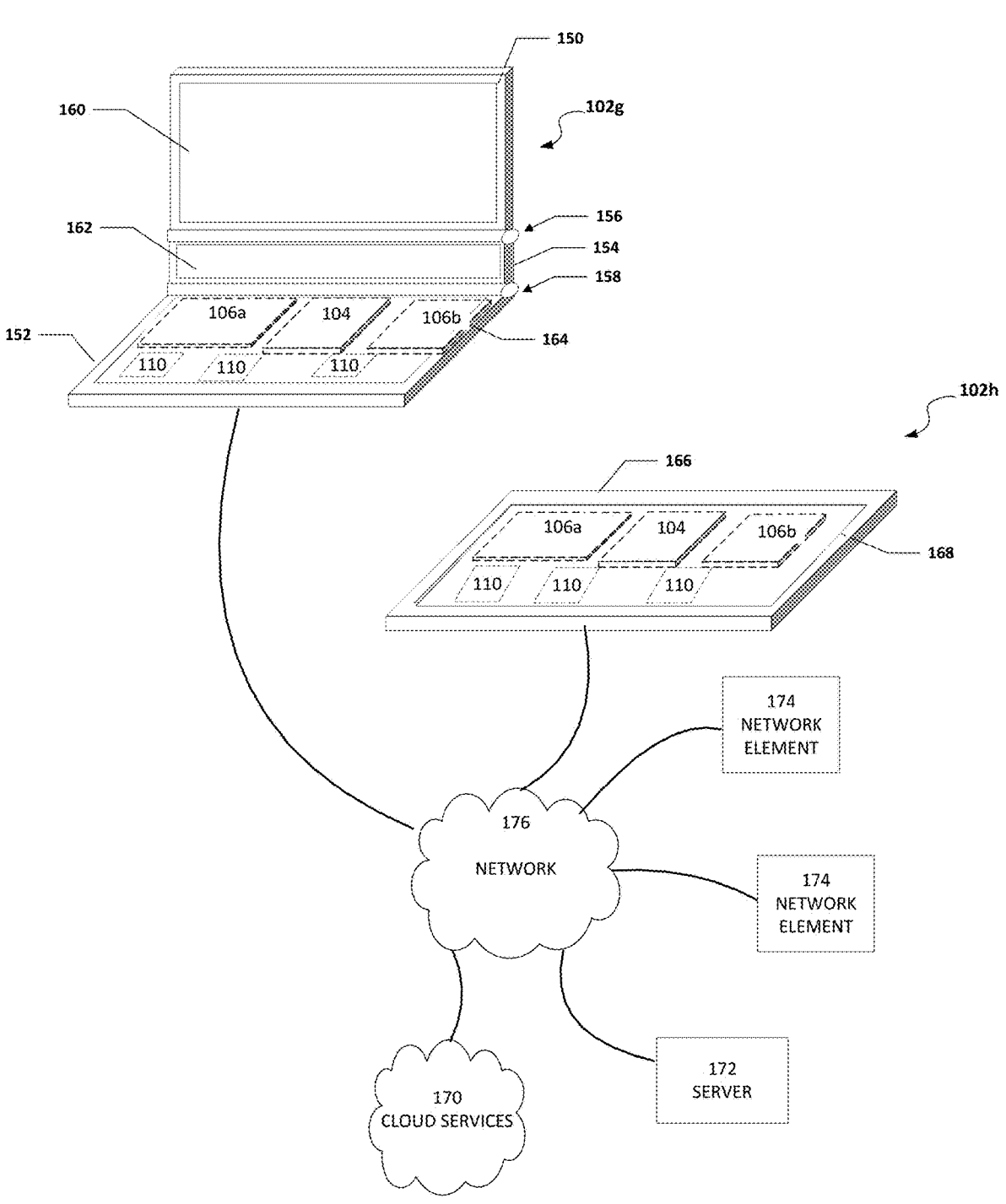
FIG. 25 is a simplified block diagram of devices that includes a fan enclosure with adjustable side venting, in accordance with an embodiment of the present disclosure.

Turning to FIG. 25, FIG. 25 is a simplified block diagram of an electronic device 100g configured with the fan enclosure with adjustable side venting and an electronic device 102h configured with the fan enclosure with adjustable side venting, in accordance with an embodiment of the present disclosure. In an example, electronic device 102g can include a first housing 150, a second housing 152, and a third housing 154. The first housing 150 can be pivotably or rotatably coupled to the third housing 154 using a first hinge 156. The third housing 154 can be pivotably or rotatably coupled to the second housing 152 using a second hinge 158. The first housing 150 can include a display 160. The second housing 152 can include a second display 164. The third housing 154 can include a third display 162. Electronic device 100g can also include the fan enclosure with adjustable side venting 104, the one or more first heat sources 106a, the one or more second heat sources 106b, a fan 108 (not shown), and the one or more electronic components 110.

In an example, electronic device 102h may only include a first housing 166. For example, electronic device 102h may be a tablet, smartphone, wearable, or some other portable device. The first housing 166 can include a display 168, the fan enclosure with adjustable side venting 104, the one or more first heat sources 106a, the one or more second heat sources 106b, a fan 108 (not shown), and the one or more electronic components 110.

Electronic device 102g and 102h (and electronic devices 102a-102f) may each be a standalone device or in communication with cloud services 170, one or more servers 172 and/or one or more network elements 174 using network 176. The network 176 represents a series of points or nodes of interconnected communication paths for receiving and transmitting packets of information. The network 176 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the network 176, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, the electronic device 102 (e.g., electronic devices 102a-102h), can encompass a computer, a personal digital assistant (PDA), a laptop or electronic notebook, a cellular telephone, an iPhone, a tablet, an IP phone, network elements, network appliances, servers, routers, switches, gateways, bridges, load balancers, processors, modules, or any other device, component, element, or object that includes a heat source and/or hot spots. The electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. The electronic device 102 may include virtual elements.

In regards to the internal structure, the electronic device 102 can include memory elements for storing information to be used in operations. The electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations described herein. This includes the memory elements being able to store software, logic, code, or processor instructions that are executed to carry out activities or operations.

Additionally, the heat source 106 (e.g., the one or more first heat sources 106*a* and the one or more second heat sources 106*b*) may be or include one or more processors that can execute software or an algorithm. In one example, the processors can transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Elements of FIG. 25 may be coupled to one another through one or more interfaces employing any suitable connections (wired or wireless), which provide viable pathways for network (e.g., the network 176, etc.) communications. Additionally, any one or more of these elements of FIG. 25 may be combined or removed from the architecture based on particular configuration needs. The network 176 may include a configuration capable of transmission control protocol/Internet protocol (TCP/IP) communications for the transmission or reception of packets in a network. The electronic device 102 may also operate in conjunction with a user datagram protocol/IP (UDP/IP) or any other suitable protocol where appropriate and based on particular needs.

Turning to the infrastructure of FIG. 25, the network 176 represents a series of points or nodes of interconnected communication paths for receiving and transmitting packets of information. The network 176 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the fan enclosure with adjustable side venting 104 has been illustrated with reference to particular elements and operations, these elements and operations may be replaced by any suitable architecture, protocols, and/or processes that achieve the intended functionality of the fan enclosure with adjustable side venting 104.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device can include a first heat source, a second heat source, and a fan inside a fan enclosure. The fan enclosure includes a main vent to direct air from the fan towards a heatsink and one or more side vents to direct air from the fan towards the first heat source or the second heat source.

In Example A2, the subject matter of Example A1 can optionally include where a slide mechanism is used to control airflow from the one or more side vents.

In Example A3, the subject matter of any one of Examples A1-A2 can optionally include where the slide mechanism includes a main body and windows and the slide mechanism is located in a channel of the fan enclosure.

In Example A4, the subject matter of any one of Examples A1-A3 can optionally include where the windows of the slide mechanism line up with the side vents to control an amount of air from the side vents.

In Example A5, the subject matter of any one of Examples A1-A4 can optionally include where a component layout of the electronic device is used to identified hot spots in the component layout and the slide mechanism is adjusted during manufacturing of the electronic device to direct airflow from the side vents to the identified hot spots in the component layout.

In Example A6, the subject matter of any one of Examples A1-A5 can optionally include where the first heat source is a central processing unit and the second heat source is a graphics processing unit.

In Example A7, the subject matter of any one of Examples A1-A6 can optionally include where an air intake of the fan is in a middle portion of the fan enclosure.

Example AA1 is a device including a first heat source, a second heat source, a fan between the first heat source and the second heat source, the fan being inside a fan enclosure. The fan enclosure includes a main vent to direct air from the fan towards a heatsink, a plurality of side vents, and a slide mechanism, wherein the slide mechanism is used to control airflow from the plurality of side vents.

In Example AA2, the subject matter of Example AA1 can optionally include where the slide mechanism includes a main body and windows and the slide mechanism is located in a channel of the fan enclosure.

In Example AA3, the subject matter of any one of Examples AA1-AA2 can optionally include where the windows of the slide mechanism line up with the side vents to control an amount of air from the plurality of side vents.

In Example AA4, the subject matter of any one of Examples AA1-AA3 can optionally include a slide mechanism engine, wherein the slide mechanism engine moves the slide mechanism inside the fan enclosure to adjust air flow from the plurality of side vents.

In Example AA5, the subject matter of any one of Examples AA1-AA4 can optionally include a thermal management engine to detect hot spots around the first heat source and the second heat source, wherein the thermal management engine is configured to cause the slide mechanism engine to move the slide mechanism to direct air from the fan towards the first heat source or the second heat source.

In Example AA6, the subject matter of any one of Examples AA1-AA5 can optionally include where the first heat source is a central processing unit and the second heat source is a graphics processing unit.

Example M1 is a method including creating a board layout for an electronic device, testing the board layout to determine a hot spot area of the board layout that will need cooling during operation of the electronic device, adding a fan enclosure with side venting to the board layout, and adjusting one or more side vents of the fan enclosure with side venting to force air onto the hot spot area of the board layout.

In Example M2, the subject matter of Example M1 can optionally include where the fan enclosure with adjustable side venting includes a main vent to direct air from a fan towards a heatsink and the one or more side vents.

In Example M3, the subject matter of any one of the Examples M1-M2 can optionally include where the fan enclosure with side venting is between a first heat source and a second heat source.

In Example M4, the subject matter of any one of the Examples M1-M3 can optionally include where a slide mechanism is used to control a size of the one or more side vents and airflow from the one or more side vents.

In Example M5, the subject matter of any one of the Examples M1-M4 can optionally include where the slide mechanism includes a main body and windows and the slide mechanism is located in a channel of the fan enclosure with side venting.

In Example, M6, the subject matter of any one of the Examples M1-M5 can optionally include where the windows of the slide mechanism line up with the one or more side vents to control an amount of air from the one or more side vents.

In Example, M7, the subject matter of any one of the Examples M1-M6 can optionally include where the slide mechanism is adjusted during manufacturing.

What is claimed is:

1. An electronic device, comprising:
a first heat source;
a second heat source;
a fan inside a fan enclosure, wherein the fan enclosure includes a main vent configured to direct air from the fan towards a heatsink;
a plurality of side vents configured to direct air from the fan towards the first heat source or the second heat source;
a channel disposed within an outer portion of the fan enclosure corresponding to a location of the plurality of side vents; and
a slide mechanism retained within the channel, the slide mechanism including a plurality of windows that selectively align with the plurality of side vents by way of a linear movement of the slide mechanism within the channel to thereby control an amount of air output from the plurality of side vents.

2. The electronic device of claim 1, wherein a component layout of the electronic device is used to identify hot spots in the component layout, and
wherein the slide mechanism is adjusted to direct airflow from the plurality of side vents to the identified hot spots in the component layout.

3. The electronic device of claim 1, wherein the first heat source is a central processing unit and the second heat source is a graphics processing unit.

4. The electronic device of claim 1, wherein an air intake of the fan is disposed in a middle portion of the fan enclosure.

5. The electronic device of claim 1, wherein at least a portion of two or more of the plurality of windows of the slide mechanism are each configured to fit within a corresponding one of the plurality of side vents.

6. A fan enclosure, comprising:
a fan disposed between a first heat source and a second heat source, the first and second heat sources being associated with an electronic device;
a main vent configured to direct air from the fan towards a heatsink;
a plurality of side vents configured to direct air from the fan towards the first heat source or the second heat source; and
a channel disposed within an outer portion of the fan enclosure corresponding to a location of the plurality of side vents; and
a slide mechanism retained within the channel, the slide mechanism including a plurality of windows that selectively align with the plurality of side vents by way of a linear movement of the slide mechanism within the channel to thereby control an amount of airflow output from the plurality of side vents.

7. The fan enclosure of claim 6, further comprising:
a slide mechanism engine configured to move the slide mechanism inside the fan enclosure to adjust the airflow output from the plurality of side vents.

8. The fan enclosure of claim 7, further comprising:

a thermal management engine configured to detect hot spots around the first heat source and the second heat source, and to cause the slide mechanism engine to move the slide mechanism to direct air from the fan towards the first heat source or the second heat source.

9. The fan enclosure of claim 6, wherein the first heat source is a central processing unit and the second heat source is a graphics processing unit.

10. A method comprising:

creating a board layout for an electronic device;

testing the board layout to determine a hot spot area of the board layout for cooling during operation of the electronic device;

adding a fan enclosure with side venting to the board layout; and adjusting a plurality of side vents of the fan enclosure with side venting to force air onto the hot spot area of the board layout, wherein the fan enclosure with side venting comprises:

a main vent configured to direct air from a fan towards a heatsink and the plurality of side vents;

a channel disposed within an outer portion of the fan enclosure corresponding to a location of the plurality of side vents; and a slide mechanism retained within the channel, the slide mechanism including a plurality of windows that selectively align with the plurality of side vents by way of the adjusting the plurality of side vents via a linear movement of the slide mechanism within the channel to control an amount of air output from the plurality of side vents.

\* \* \* \* \*